United States Patent
Cha et al.

(10) Patent No.: US 7,291,906 B2
(45) Date of Patent: Nov. 6, 2007

(54) STACK PACKAGE AND FABRICATING METHOD THEREOF

(76) Inventors: Ki Bon Cha, 101-802 Samjeongbaekjo Apartment, Shinbong dong, Heungduk-ku, Cheongju-shi, Chungcheongbuk-Do (KR); Dong You Kim, 96 Jeonghadong, Sangdangku, Cheongju-shi, Chungcheongbuk-Do (KR)

( * ) Notice: Subject to any disclaimer, the term of this patent is extended or adjusted under 35 U.S.C. 154(b) by 119 days.

(21) Appl. No.: 10/745,566

(22) Filed: Dec. 29, 2003

(65) Prior Publication Data

US 2004/0150107 A1    Aug. 5, 2004

(51) Int. Cl.
H01L 23/42    (2006.01)
H01L 23/58    (2006.01)
H01L 23/02    (2006.01)

(52) U.S. Cl. ............... 257/686; 257/777; 257/702; 257/E23.169

(58) Field of Classification Search ............... 257/686, 257/777, 702, 723
See application file for complete search history.

(56) References Cited

U.S. PATENT DOCUMENTS

| | | | |
|---|---|---|---|
| 5,776,797 A * | 7/1998 | Nicewarner et al. | 438/107 |
| 6,683,377 B1 * | 1/2004 | Shim et al. | 257/723 |
| 2003/0168725 A1 * | 9/2003 | Warner et al. | 257/686 |

* cited by examiner

*Primary Examiner*—Nitin Parekh
(74) *Attorney, Agent, or Firm*—John Naber; Dickinsonwright, PLLC

(57) ABSTRACT

Disclosed are a stack package and a fabricating method thereof using a ball grid array semiconductor package (hereinafter, referred to as "BGA PKG"). The stack package can easily electrically connect the stacked BGA PKGs with each other by simplifying a stack structure between the BGA PKGs, and increase bonding reliability by improving bonding force bonded portions of solder balls of substrates.

13 Claims, 48 Drawing Sheets

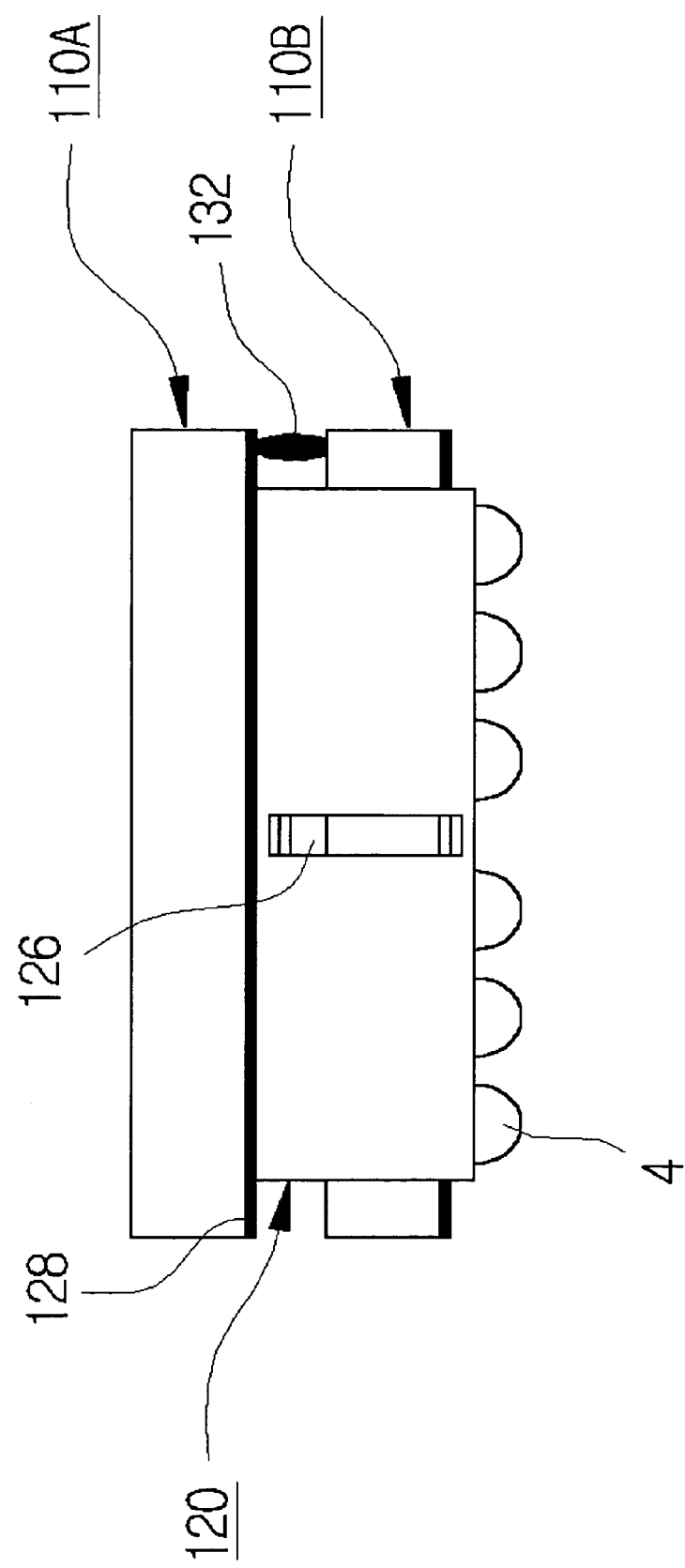

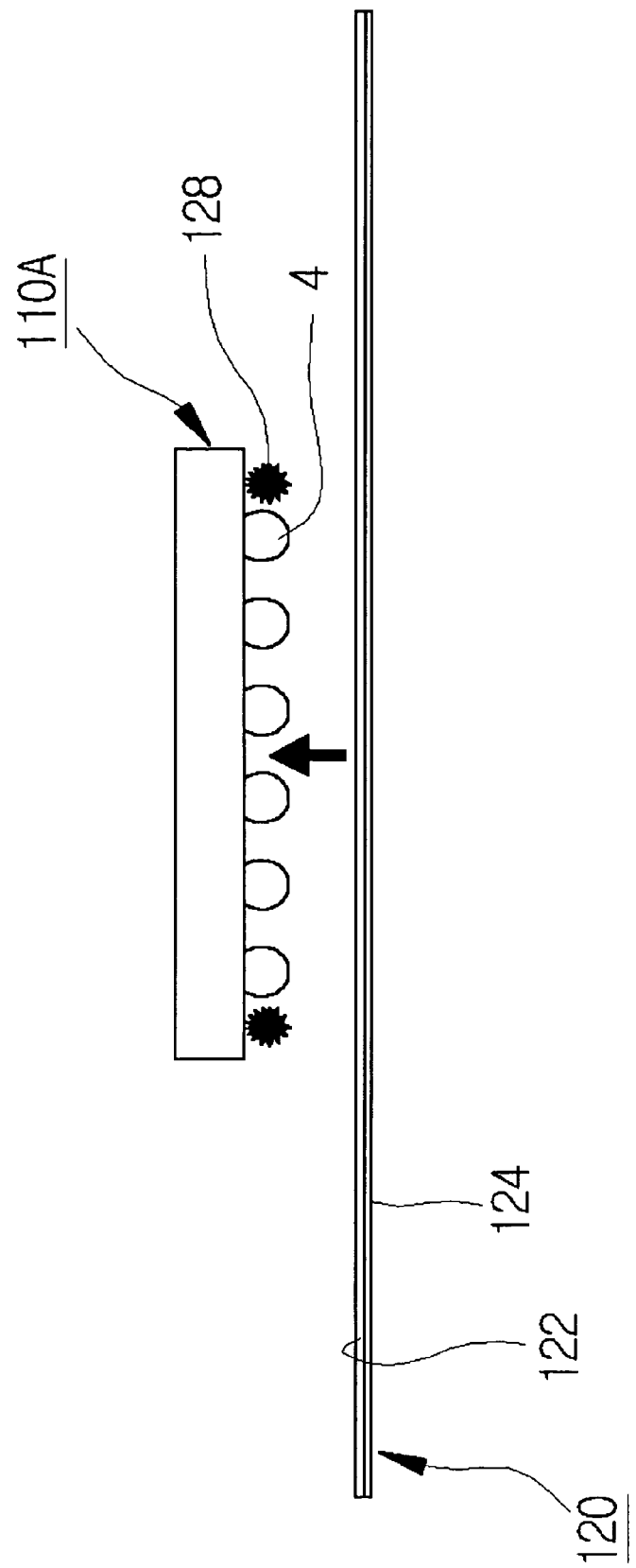

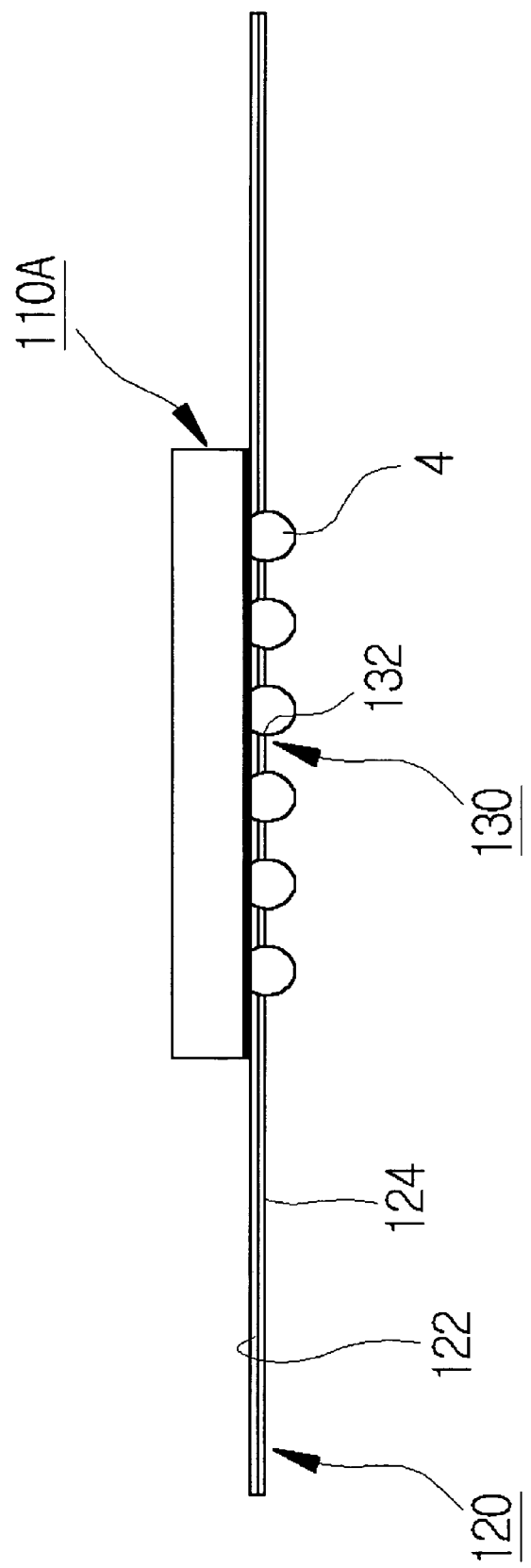

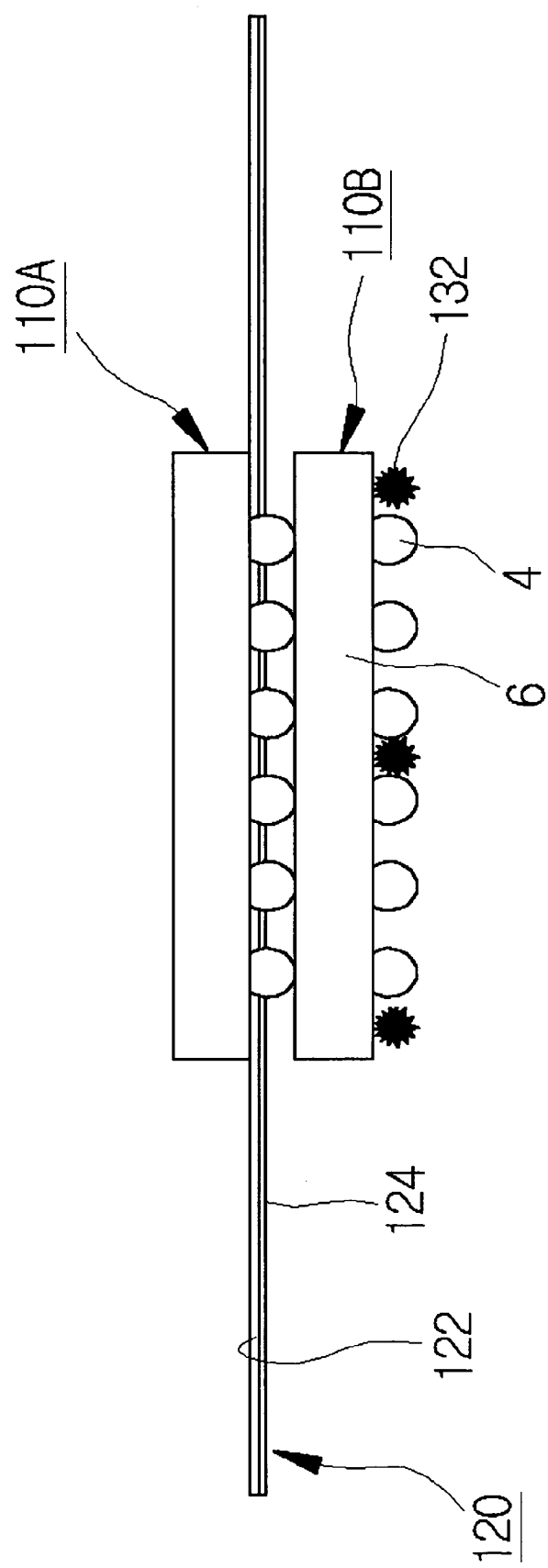

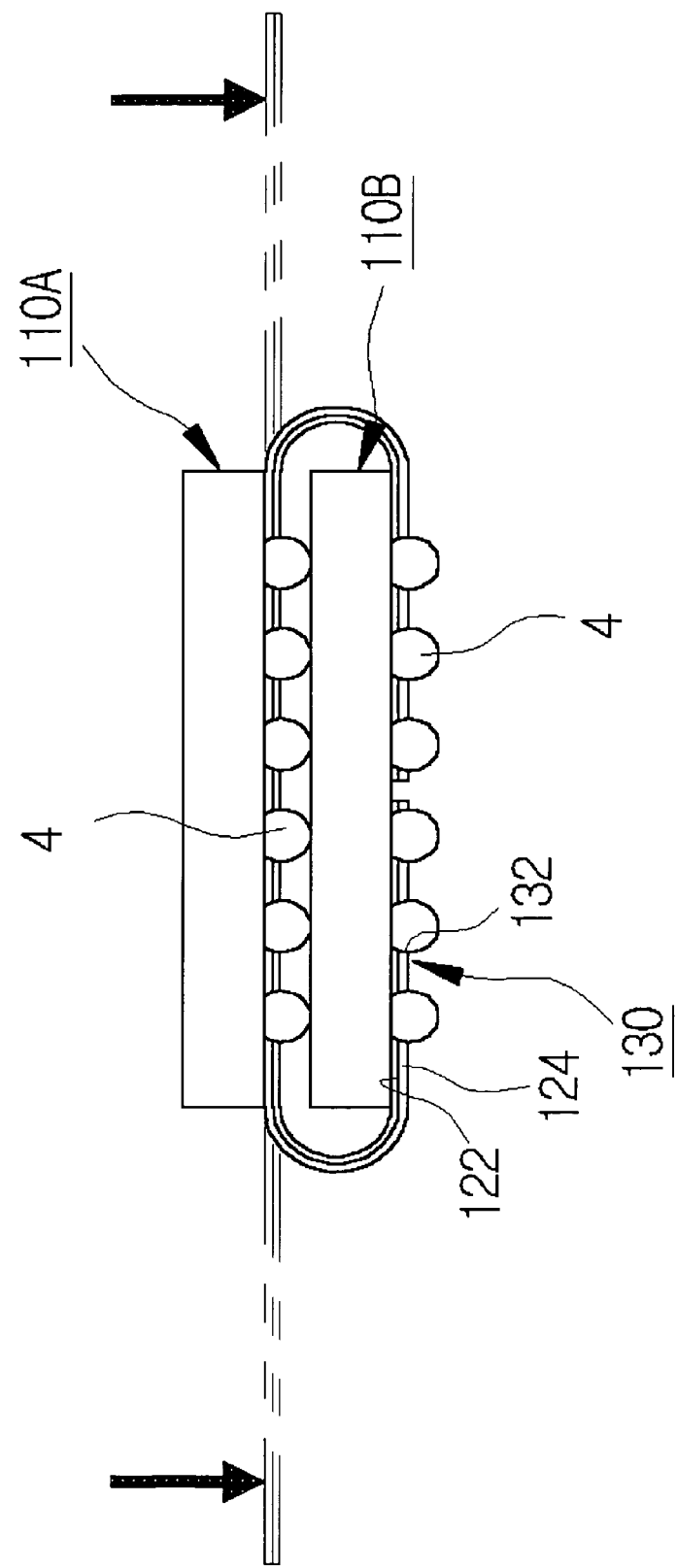

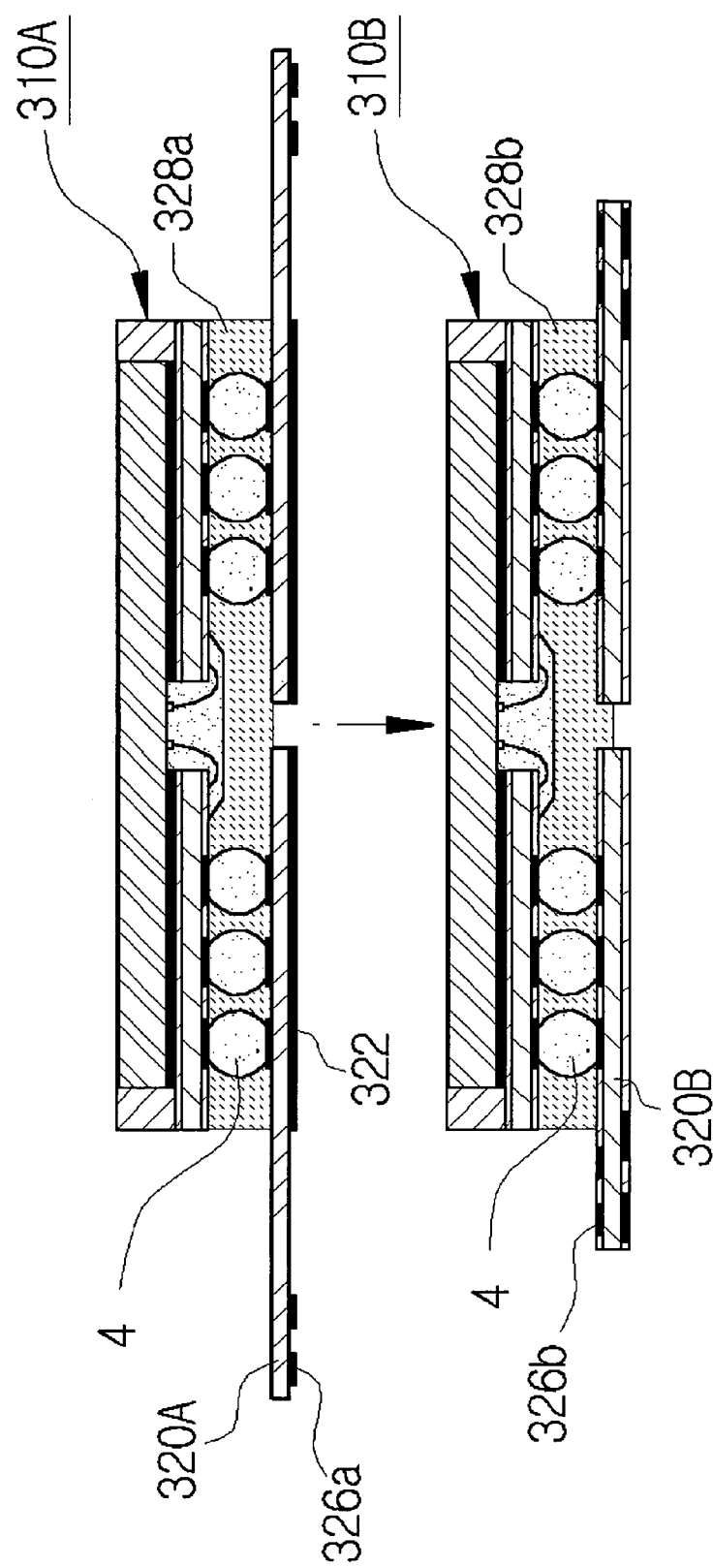

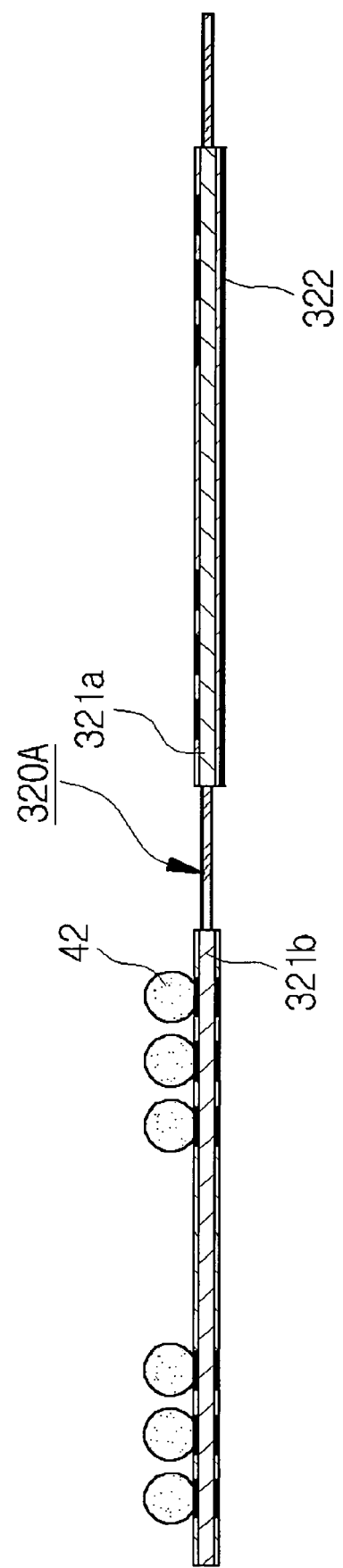

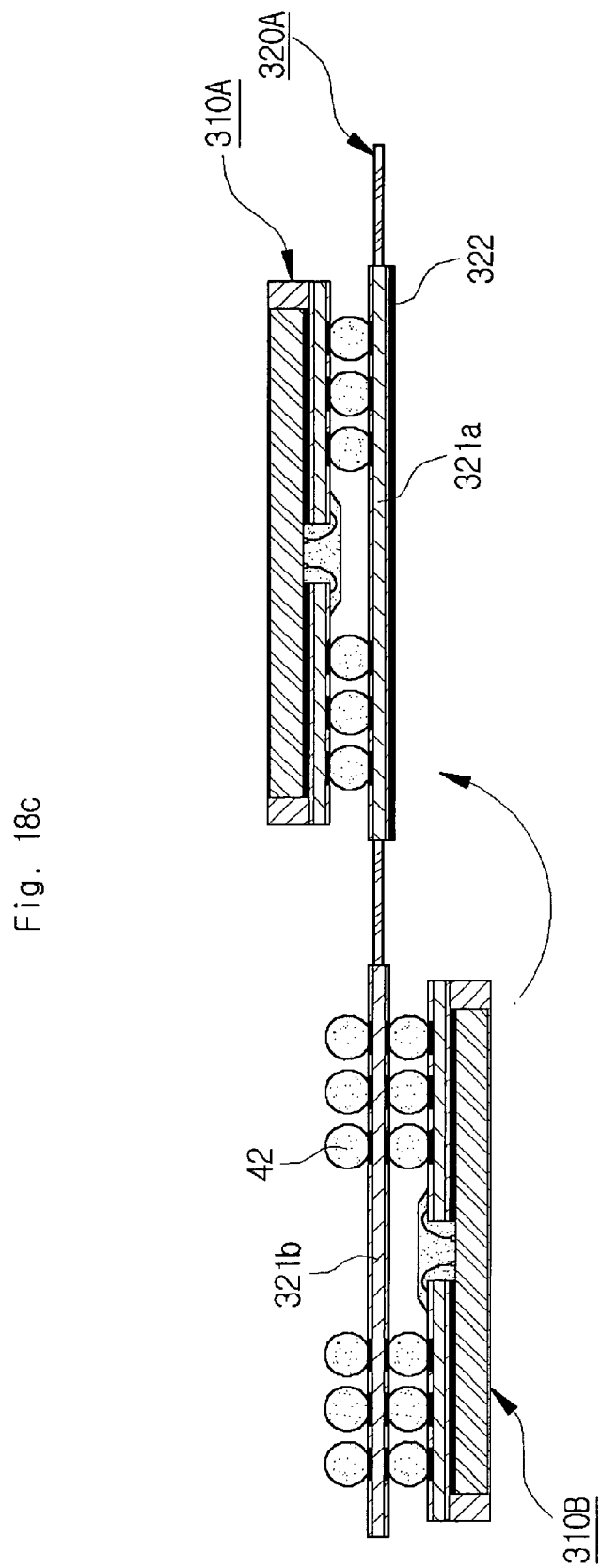

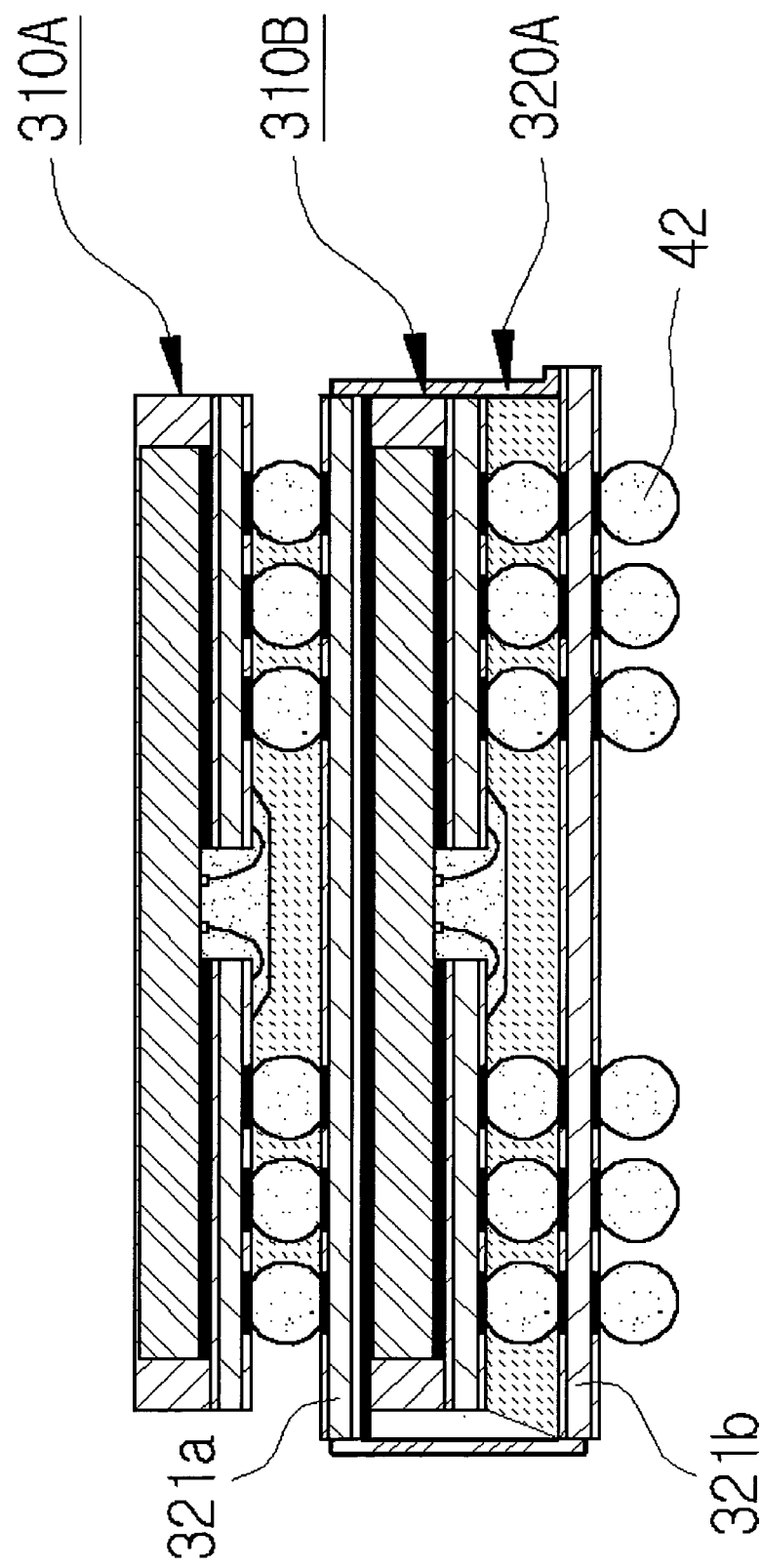

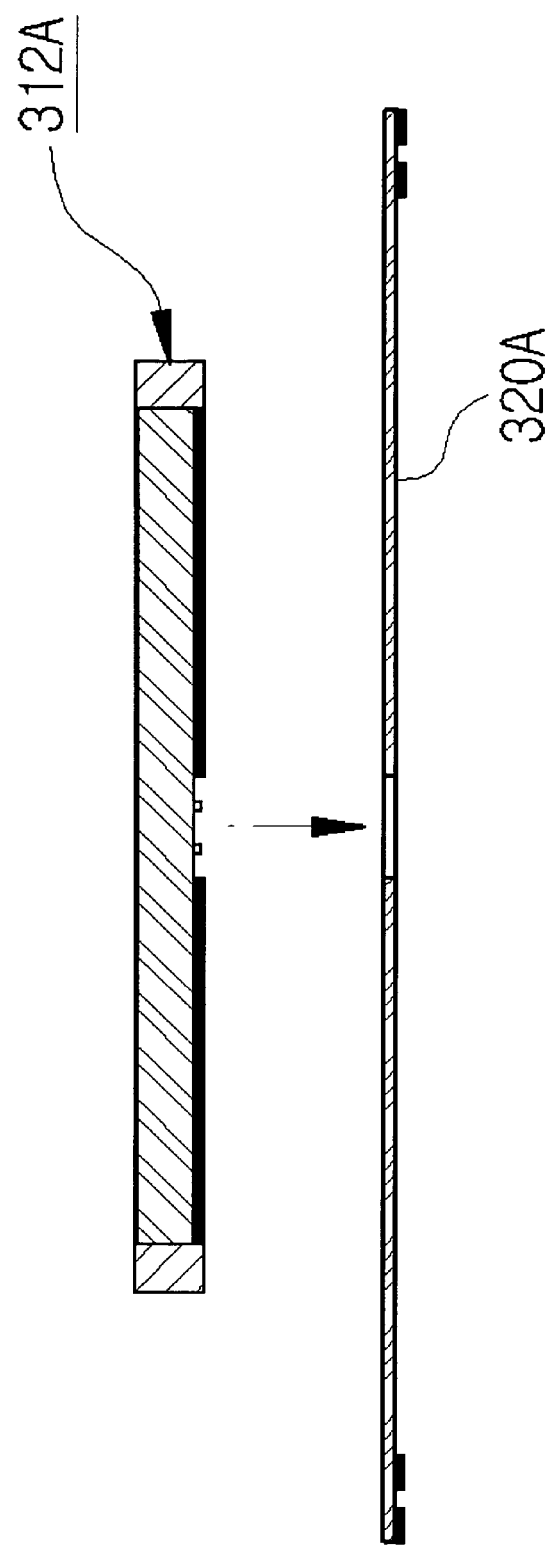

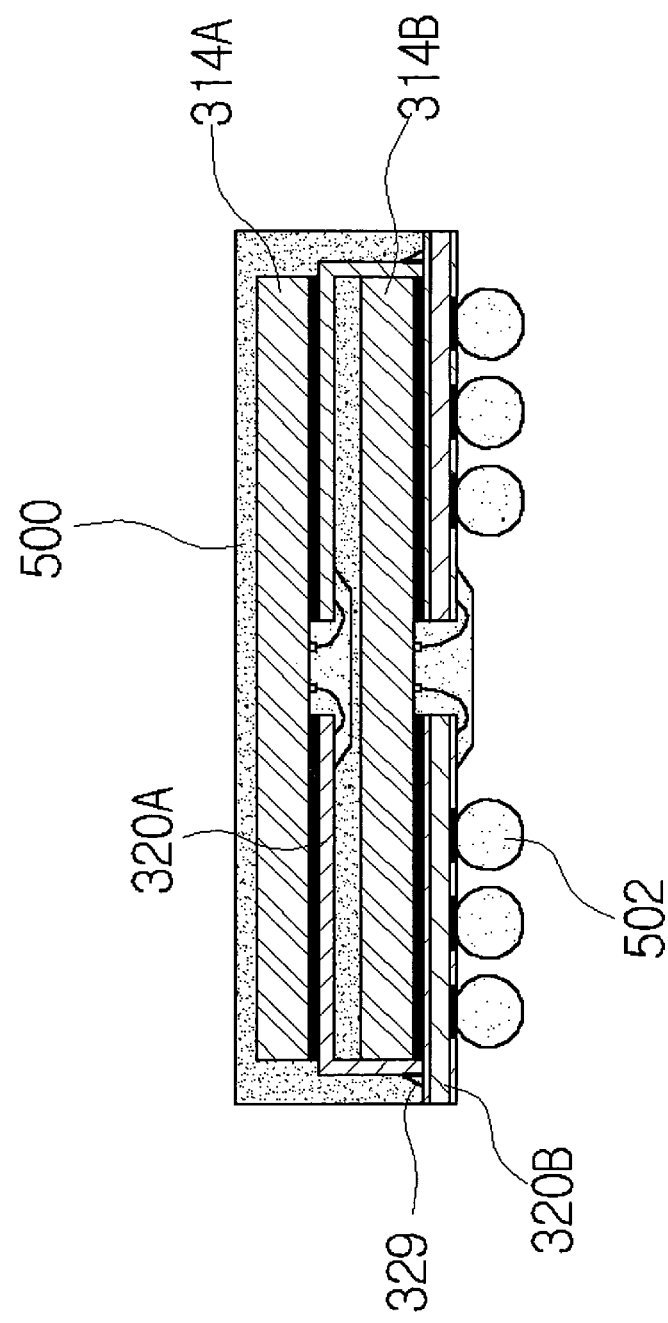

STACK PACKAGE AND FABRICATING METHOD THEREOF

This application claims priority from Korean Utility Model Application 2002-39178, filed Dec. 31, 2002, Korean Utility Model Application 2003-7063, filed Mar. 10, 2003, Korean Patent Application 2003-56146, filed Aug. 31, 2003 and Korean Patent Application 2003-77814, filed Nov. 5, 2003, the entire contents of which are herein incorporated by reference to the extent allowed by law.

BRIEF DESCRIPTION OF THE DRAWINGS

FIG. 4 is a side sectional view of FIG. 2.

FIGS. 5a to 5d are views showing manufacturing processes of the stack package of FIG. 2 in order.

FIGS. 12a to 12d are views showing manufacturing processes of the stack package of FIG. 11 in order.

FIGS. 18a to 18d are views showing manufacturing processes of the stack package of FIG. 17 in order.

FIG. 19 is a view of a modification of the stack package of FIG. 17.

FIGS. 21a to 21c are views showing manufacturing processes of the stack package of FIG. 20 in order.

FIG. 28 is a view of a stack package according to a seventh preferred embodiment of the present invention.

BACKGROUND OF THE INVENTION

The present invention relates to a stack package and a fabricating method thereof using a ball grid array semiconductor package(hereinafter, referred to as "BGA PKG").

In general, semiconductor elements and a package technology of them have been continuously developed together for the purpose of high density, high speed, miniaturization, and thin-film.

Particularly, a rapid progress of a package structure from a pin-insertion type to a surface-mounting type has increased a mounting density of a circuit board.

Recently, a chip scale package(hereinafter, referred to as a "CSP"), which is easy to handle and reduced in size of the package while keeping features of a bare chip in a packed state as they are.

Figure 1:
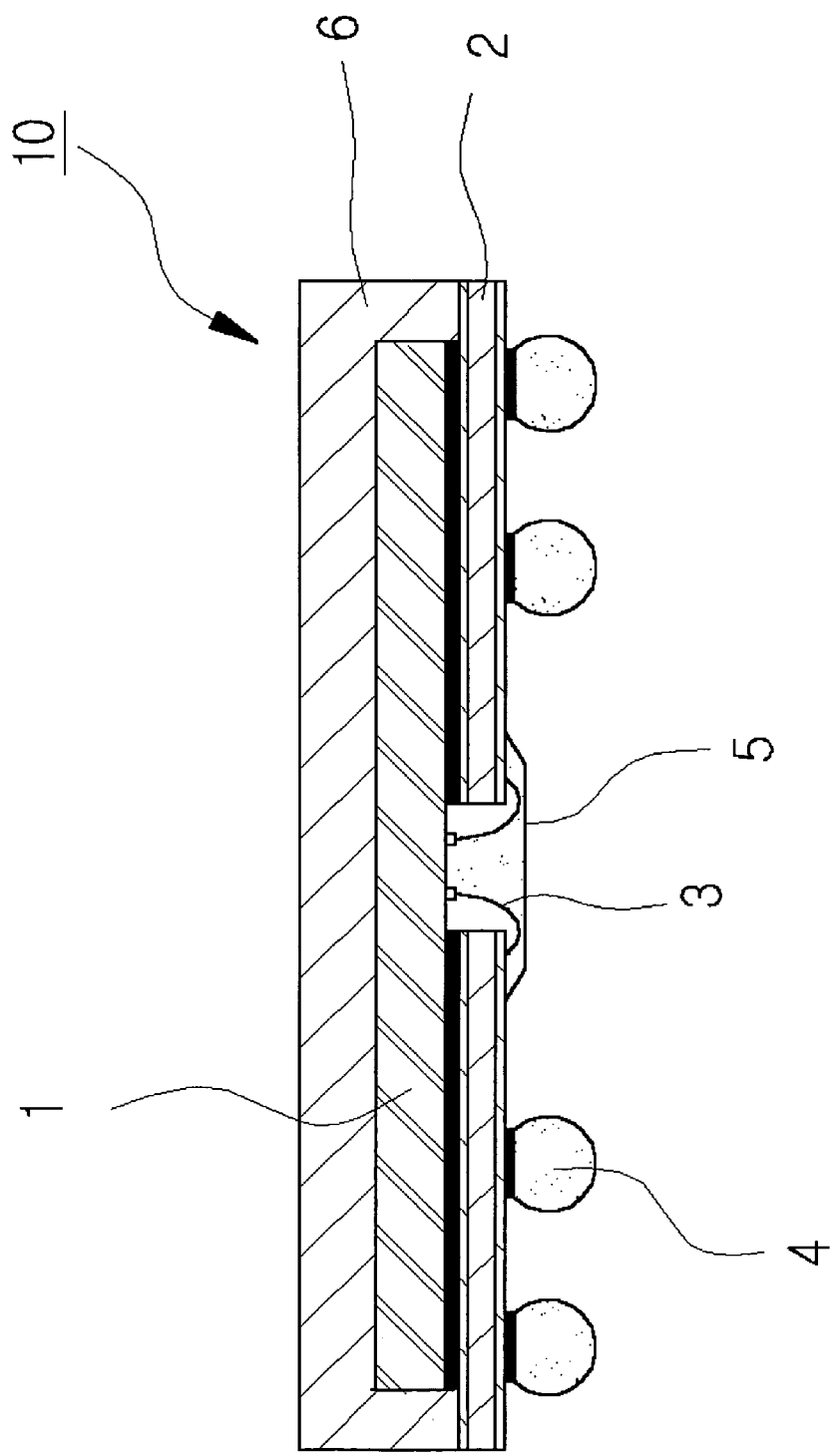
FIG. 1 is a view of a conventional ball grid array semiconductor package.

The most remarkable package of the various packages is a BGA package, and it is shown in FIG. 1.

FIG. 1 shows a common structure of the BGA package.

As shown in the drawing, the BGA PKG 10 includes: a semiconductor chip 1 directly connected with an electronic circuit; a circuit board 2 for transmitting signal of the semiconductor chip 1 to the outside; wires 3 for electrically connecting the circuit board 2 and the semiconductor chip 1; an insulating material 5 of resin material molded for protecting the wires 3; and a number of solder balls 4 fused on the lower surface of the circuit board 2 for inputting and outputting the signal of the semiconductor chip 1 to the outside. Furthermore, the semiconductor chip 1 has a molded portion 6 formed on the outside thereof for protecting the whole semiconductor chip 1 from the outside.

As described above, recently, the stack package increased in capacity and mounting density using the BGA PKG 10 attracts the attention of people.

However, differently from a stacked-chip package in which unpacked semiconductor elements are stacked, such stack package has a complicated structure in which a number of unit packages assembled separately are stacked.

So, such stack package has a disadvantage in that there is no work for electrically connecting the stacked packages with each other.

SUMMARY OF THE INVENTION

Accordingly, the present invention has been made to solve the problems of the prior arts, and an object of the present invention is to provide a stack package and a fabricating method thereof, which can connect stacked BGA packages with each other to increase electrical features of the stacked BGA packages.

Another object of the present invention is to provide a stack package and a fabricating method thereof, which can improve bonding force of a substrate bonding part of solder balls.

DESCRIPTION OF THE INVENTION

To achieve these objects, in one aspect of the invention, there is provided a stack package, in which at least two or more BGA PKGs are stacked, the stack package comprises: a flexible substrate having a circuit pattern layer formed on the surface thereof and connected with solder balls to input and output electric signals, the flexible substrate having a length extending to the outside of the BGA PKGs in both side directions of the BGA PKGs and being located between the BGA PKGs, the extending side portions of the flexible substrate being bended in contact with the lower surface of one of the BGA PKGs; and holes formed positions corresponding to the solder balls of the flexible substrate for allowing the solder balls to be inserted thereinto and in contact with the holes in such a manner to electrically connected with the circuit pattern layer of the flexible substrate.

Each of the holes has slits formed along the circumferences of the holes at regular intervals.

The flexible substrate has a space of a predetermined width formed in the side thereof.

The stack package further includes a package-bonding adhesive located between the stacked BGA PKGs to bond the stacked BGA PKGs more strongly.

In another aspect of the present invention, a stack package, in which at least two or more BGA PKGs having solder balls are stacked, comprises: a first rigid substrate having the same area as the BGA PKGs and a circuit pattern layer disposed on the surface thereof to be electrically connected with the solder balls, the first rigid substrate being mounted between the BGA PKGs to be electrically connected with the BGA PKGs, the first rigid substrate having protrusions formed downwardly from both ends thereof to form a space for mounting the circuit pattern layer; and a second rigid substrate having a circuit pattern layer disposed on the surface thereof to be electrically connected with solder balls of the BGA PKGs, the circuit pattern layer being electrically connected with the solder balls of the BGA PKGs and the circuit pattern layer of the first rigid substrate when the second rigid substrate is located at the lowermost portion of the BGA PKG.

Each of the protrusions has at least two or more holes for mounting the circuit pattern layer, and the holes are formed in the longitudinal direction of the protrusion.

One of the holes has a semicircular section and is exposed to the outside.

The second rigid substrate has solder balls fused on the lower portion thereof.

In another aspect of the present invention, a stack package, in which at least two or more BGA PKGs having solder balls are stacked, comprises: a flexible substrate of the size wider than that of the BGA PKGs, the flexible substrate having a circuit pattern layer disposed on the surface thereof to be electrically connected with the solder balls, the flexible substrate being located between the BGA PKGs to be connected with the BGA PKGs and having both end portions bended in contact with side walls of the BGA PKGs stacked on the lower portion thereof; and a rigid substrate of the side wider than the BGA PKGs, the rigid substrate being located at the lowermost portion of the BGA PKG to support the BGA PKG, the rigid substrate having a circuit pattern layer disposed on the surface thereof in such a manner to be electrically connected with the solder balls of the BGA PKGs and the flexible substrate.

The flexible substrate has metallic pads located at the bended portions thereof, and the bended portions are soldered in such a manner to be connected to the upper surface of the rigid substrate.

The flexible substrate has metallic pads located at the bended portions thereof, and the bended portions are soldered in such a manner to be in contact with both side surfaces of the rigid substrate.

One of the BGA PKGs has a case mounted on the outside thereof to reinforce the flexible substrate.

The flexible substrate has at least two or more rigid materials mounted at least two or more positions thereof, the rigid materials having the corresponding width of the BGA PKGs.

The flexible substrate is bended in such a manner to completely surround the rigid substrate.

The flexible substrate has coupling holes for inserting and fusing the solder balls.

In another aspect of the present invention, a stack package, in which at least two or more bare chips are stacked, comprises: a flexible substrate of the size wider than that of the bare chips, the flexible substrate having a circuit pattern layer formed on the surface thereof and an opening formed in the center thereof for connecting the bare chip, the flexible substrate being located between the bare chips to be electrically connected with the bare chips, both end portions of the flexible substrate being bended and located at both lower portions of the lower bare chip; and a rigid substrate of the same width as the flexible substrate, the rigid substrate being located at the lowermost portion of the bare chip to support the bare chip, the rigid substrate having a circuit pattern layer disposed on the surface thereof in such a manner to be electrically connected with the bare chips and the flexible substrate, the rigid substrate having an opening formed in the center thereof for connecting the bare chip.

The bended portions of the flexible substrate are connected to the surface of the rigid substrate.

The bended portions of the flexible substrate are connected to both side walls of the rigid substrate.

The stack package according to claim 16 includes a case for surrounding the whole outside of the flexible substrate to keep the form of the flexible substrate.

In another aspect of the present invention, a method for fabricating a stack package by stacking at least two or more BGA PKGs, the method comprises the steps of: preparing a flexible substrate, the flexible substrate having the width wider than that of the BGA PKGs and having a circuit pattern layer for electrically connecting with the BGA PKGs; preparing a rigid substrate, the rigid substrate having the width wider than that of the BGA PKGs and having a circuit pattern layer for electrically connecting with the BGA PKGs; mounting the BGA PKGs on the upper surfaces of the flexible substrate and the rigid substrate respectively; stacking the flexible substrate, on which the BGA PKG is mounted, on the upper portion of the rigid substrate, on which the other BGA PKG is mounted; bending both end portions of the flexible substrate downwardly in such a manner to be in contact with side walls of the BGA PKG mounted on the rigid substrate, and connecting the bended portions of the flexible substrate to the rigid substrate in such a manner to be electrically connected with the rigid substrate; and fusing solder balls onto the lower portion of the rigid substrate to transmit electric signals of the stacked BGA PKGs.

The flexible substrate preparing step further includes a step of forming coupling holes for coupling the solder balls with the BGA PKG.

In another aspect of the present invention, there is also provided a method for fabricating a stack package by stacking at least two or more BGA PKGs, including the steps of: preparing a flexible substrate, the flexible substrate having the width wider than that of the BGA PKGs and having a circuit pattern layer for electrically connecting with the BGA PKGs; forming rigid portions corresponding to the width of the BGA PKG by coating rigid material at least two or more positions of the flexible substrate at a predetermined interval; mounting the solder balls and the BGA PKG at both sides of one of the rigid portions, and mounting only the BGA PKG at the other rigid portion; bending the flexible substrate, on which the BGA PKG and the solder balls are mounted, in such a manner to completely surround only the mounted BGA PKG, and connecting the flexible substrate and the BGA PKG to transmit electric signals with each other; and fusing the solder balls at the lowermost portions of the rigid portions of the flexible substrate in such a manner to transmit the electric signals of the stacked packages.

In another aspect of the present invention, there is provided a method for fabricating a stack package by stacking at least two or more bare chips, including the steps of: preparing a flexible substrate, the flexible substrate having the width wider than that of the bare chips and having a circuit pattern layer for electrically connecting with the bare chips; preparing a rigid substrate, the rigid substrate having the width wider than that of the bare chips and having a circuit pattern layer for electrically connecting with the bare chips; mounting the bare chips on the upper surfaces of the flexible substrate and the rigid substrate respectively; wire-bonding the bare chips, which are mounted on the flexible substrate and the rigid substrate respectively, using gold wires to be connected with the circuit pattern layers of the flexible substrate and the rigid substrate; molding the wire-connected portions of the flexible substrate and the rigid substrate with insulating material to surround the and protect the wire-connected portions; stacking the flexible substrate, on which the bare chip is mounted, on the upper portion of the rigid substrate, on which the other bare chip is mounted; bending both end portions of the flexible substrate downwardly in such a manner to be in contact with side walls of the bare chip mounted on the rigid substrate, and connecting the bended portions of the flexible substrate to the rigid substrate in such a manner to be electrically connected with the rigid substrate; and fusing solder balls onto the lower portion of the rigid substrate to transmit electric signals of the stacked bare chips.

In another aspect of the present invention, there is provided a method for fabricating a stack package by stacking at least two or more BGA PKGs, including the steps of: preparing a flexible substrate, the flexible substrate having the width wider than that of the BGA PKGs and having a circuit pattern layer for electrically connecting with the BGA PKGs; preparing a rigid substrate, the rigid substrate having the width wider than that of the BGA PKGs and having a circuit pattern layer for electrically connecting with the BGA PKGs; mounting one of the BGA PKGs on the upper surface of the rigid substrate; bonding the flexible substrate on the upper surface of the BGA PKG mounted on the rigid substrate; bending both end portions of the flexible substrate downwardly in such a manner to be in contact with side walls of the BGA PKG mounted on the rigid substrate, and connecting the bended portions of the flexible substrate to the rigid substrate in such a manner to be electrically connected with the rigid substrate; covering a case, which has a space formed in the upper portion thereof, onto the flexible substrate to reinforce the bended portions of the flexible substrate; mounting another BGA PKG on the upper surface of the flexible substrate through the space of the case; and fusing solder balls onto the lower portion of the rigid substrate to transmit electric signals of the stacked BGA PKGs.

The step of electrically connecting the flexible substrate and the rigid substrate with each other includes a step of contacting both end portions of the flexible substrate to the upper surface of the rigid substrate.

The step of electrically connecting the flexible substrate and the rigid substrate with each other further includes a step of contacting both end portions of the flexible substrate to side surfaces of the rigid substrate.

In another aspect of the present invention, there is provided a method for fabricating a stack package by stacking at least two or more bare chips, including the steps of: preparing a flexible substrate, the flexible substrate having the width wider than that of the bare chips and having a circuit pattern layer for electrically connecting with the bare chips; preparing a rigid substrate, the rigid substrate having the width wider than that of the bare chips and having a circuit pattern layer for electrically connecting with the bare chips; mounting one of the bare chips on the upper surface of the rigid substrate, connecting and bonding the mounted bare chip and the rigid substrate with a wire to electrically connect the mounted bare chip with the circuit pattern layer of the rigid substrate, and coating the bonded portion; mounting the other of the bare chips on the upper surface of the flexible substrate, connecting and bonding the mounted bare chip and the flexible substrate with a wire to electrically connect the mounted bare chip with the circuit pattern layer of the flexible substrate, and coating the bonded portion; stacking the flexible substrate, on which the bare chip is mounted, on the upper portion of the rigid substrate, on which the other bare chip is mounted; bending both end portions of the flexible substrate downwardly in such a manner to be in contact with side walls of the bare chip mounted on the rigid substrate, and soldering and connecting the bended portions of the flexible substrate to the rigid substrate in such a manner to be electrically connected with the rigid substrate; molding the upper surface of the rigid substrate, the flexible substrate and the bare chips together with insulating material to protect them; and fusing solder balls onto the lower portion of the rigid substrate to transmit electric signals of the stacked bare chips.

The step of electrically connecting the flexible substrate and the rigid substrate includes a step of covering a case onto the flexible substrate to reinforce the bended portions of the flexible substrate, and the molding step includes a step of molding the case to be sunken.

The present invention will now be described in detail in connection with preferred embodiments with reference to the accompanying drawings.

Figure 2:
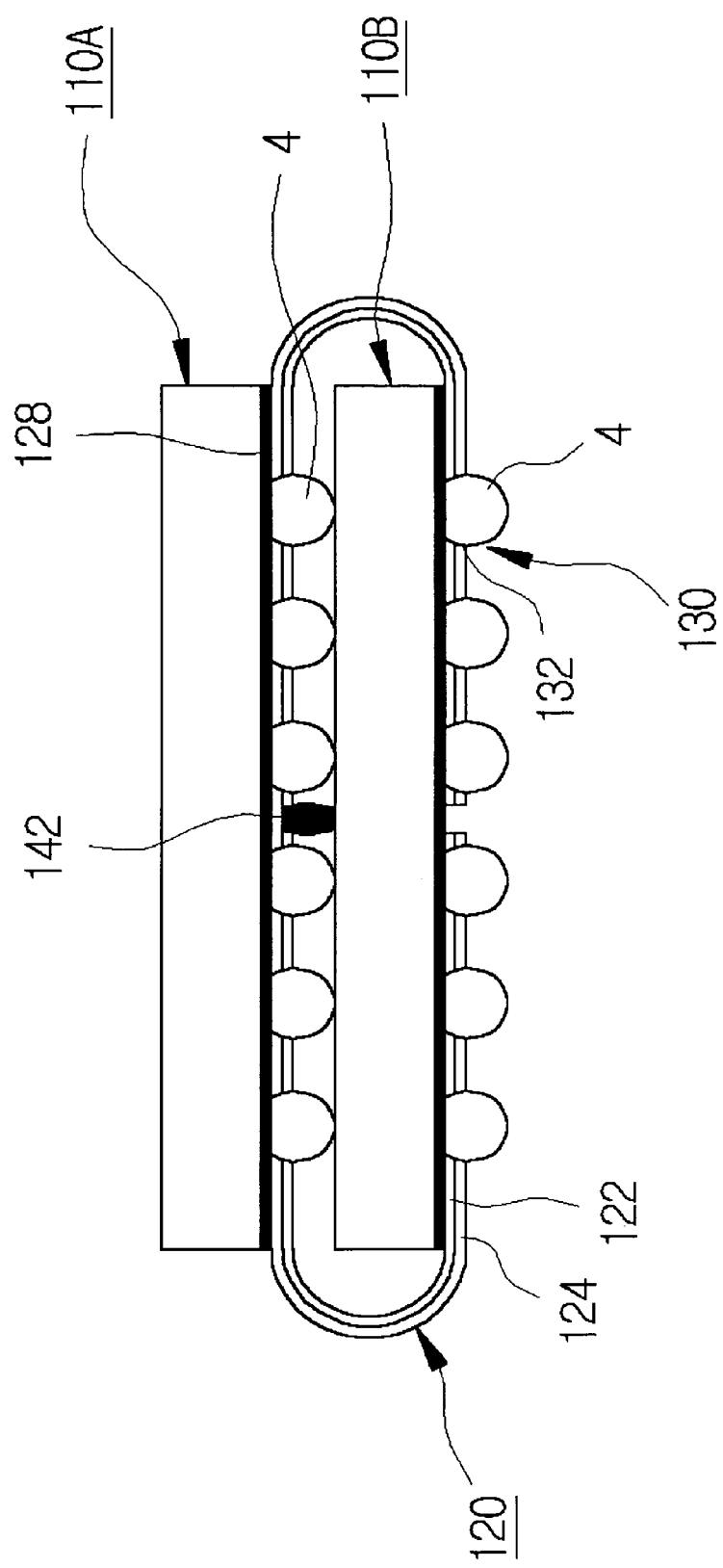
FIG. 2 is a view of a stack package according to a first preferred embodiment of the present invention.

FIG. 2 is a view of a stack package according to a first preferred embodiment of the present invention.

In FIG. 2, the same parts as FIG. 1 have the same reference numerals.

As shown in the drawing, in the stack package, at least two or more BGA PKGs 110A and 110B, described above referring to FIG. 1, which have been fabricated previously, are stacked. The stack package has a flexible substrate 120 for stacking the BGA PKGs 110A and 110B.

The flexible substrate 120 is made of flexible material, and has a circuit pattern layer 122 and an insulating layer 124 for electrically connecting the BGA PKGs 110A and 110B.

The BGA PKGs 110A and 110B are stacked on the flexible substrate 120 in order to be electrically connected with the circuit pattern layer 122.

The flexible substrate 120 may have a solder mask layer(not shown) formed thereon to protect the circuit pattern layer 122.

The flexible substrate 120 has a connection part 130 disposed thereon to electrically connect the substrate 120 and the BGA PKGs 110A and 110B.

The connection part 130 is a number of solder balls 4 inserted into holes 132 perforating through the circuit pattern layer 122 and the insulating layer 124 of the flexible substrate 120. When the solder balls 4 are inserted into the holes 132, the solder balls 4 and the circuit pattern layer 122 exposed by the holes 132 are electrically connected with each other.

It is preferable that the diameter of the holes 132 is somewhat smaller than the maximum diameter of the solder balls 4. The reason is to maintain bonding force between the solder balls 4 and the circuit pattern layer 122 by fitting the solder balls 4 into the holes 132.

Figure 3:
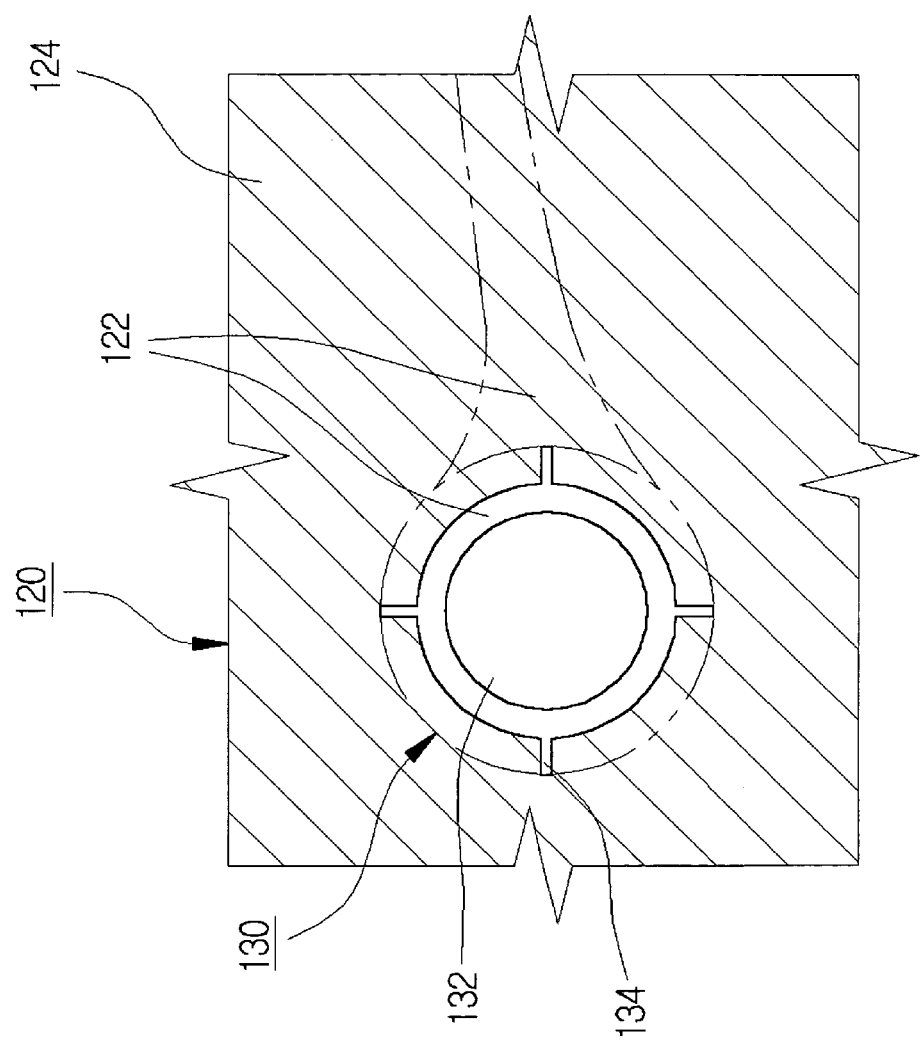
FIG. 3 is a plan view showing only a hole formed in a substrate applied to the stack package of FIG. 2.

FIG. 3 is a plan view showing only the hole of the substrate shown in FIG. 2.

The hole 132 is in the form of a circle and has slits 134 formed in the circumference of the hole 132 at regular intervals. The slits 134 serve to fit the solder ball 4, which has the diameter larger than that of the hole 132, into the hole 132 smoothly.

Moreover, the slits 134 serve to connect the circuit pattern layer 122 of the flexible substrate 120 and the BGA PKGs 110A and 110B when the solder ball 4 is inserted into the hole 132. For more secure connection between the flexible substrate 120 and the BGA PKGs 110A and 110B, an adhesive 128 may be interposed between the flexible substrate 120 and the BGA PKGs 110A and 110B to bond them. It is preferable that the adhesive 128 is coated on a surface of the BGA PKGs 110A and 110B before the flexible substrate 120 is mounted. It will be appreciated that an adhesive tape may be used in place of the adhesive 128.

Additionally, the solder balls 4 disposed on the BGA PKGs 110A and 110B can be integrated with the holes 132 through a reflow process after the insertion of the solder balls into the holes 132, and it improves electricity by keeping a more secure connection between the solder balls 4 and the holes 132.

Furthermore, a package-bonding adhesive 142 is located between the stacked BGA PKGs 110A and 110B to bond the stacked BGA PKGs 110A and 110B more strongly.

In the above, a method for connecting the flexible substrate 120 onto side surfaces of the stacked BGA PKGs 110A and 110B is described, but the flexible substrate 120 may be connected onto both sides of or all sides of the stacked BGA PKGs 110A and 110B.

FIG. 4 is a side view of FIG. 2.

The flexible substrate 120 has a space 126, which will be located to sides of the stacked BGA PKGs 110A and 110B, for exactly fixing the stacked BGA PKGs 110A and 110B when the stack package is tested or loaded on a tray.

FIGS. 5a to 5d are views showing fabricating processes of the stack package of FIG. 2 in order.

As shown in FIG. 5a, the lower surface of the BGA PKG 110A, which has been fabricated previously, is coated with the adhesive 128, and the flexible substrate 120 having the holes 132 is located thereon.

In this state, as shown in FIG. 5b, the BGA PKG 110A is bonded to the flexible substrate 120 while the solder balls 4 are inserted and fit into the holes 132 of the flexible substrate 120. At this time, the flexible substrate 120 can be coated with the adhesive beforehand.

In this condition, to finish the stack package shown in FIG. 2, after the second BGA PKG 110B is located on the lower portion as shown in FIG. 5c, both ends of the flexible substrate 120 are bended downwardly as shown in FIG. 5d, and the solder balls 4 of the second BGA PKG 110B located on the lower portion are inserted and fit into the holes 132 of the flexible substrate 120.

For strong bonding, the package-bonding adhesive 142 can be disposed between the stacked BGA PKGs.

Figure 6:
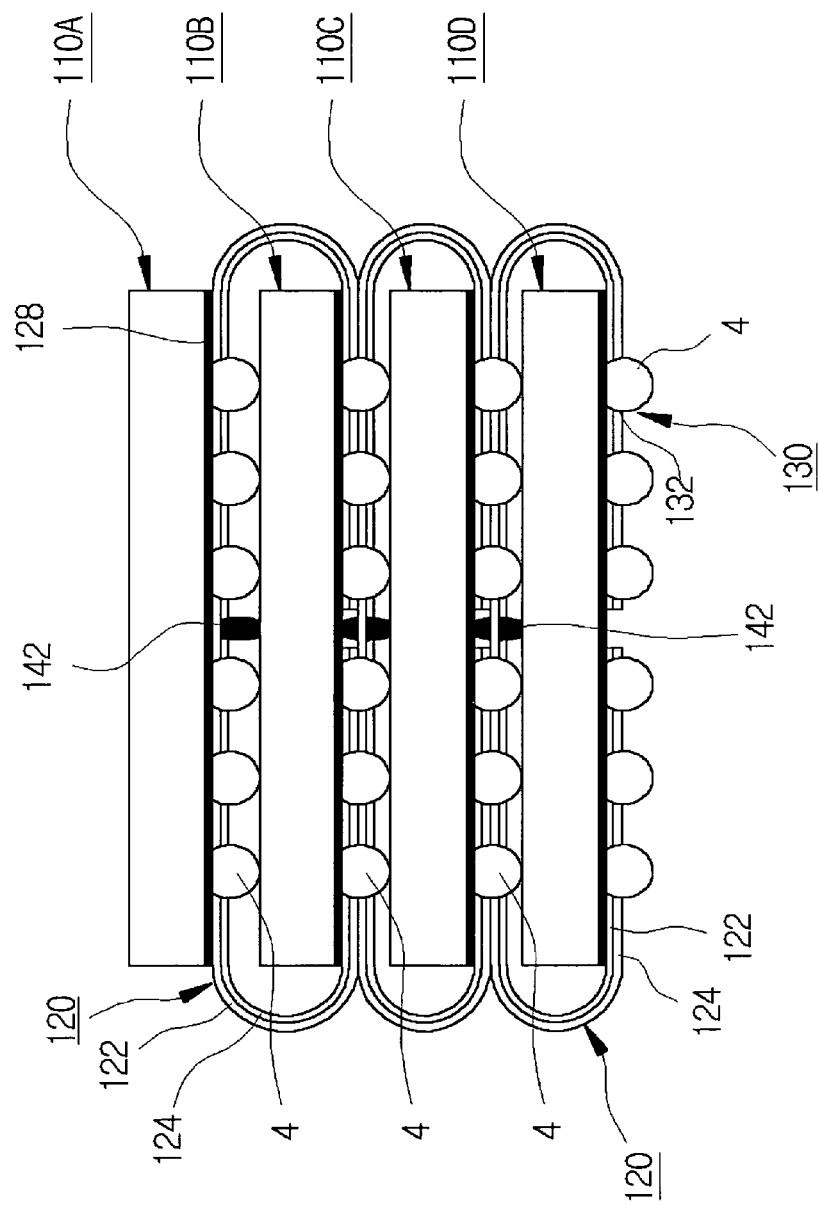
FIG. 6 is a view of a modification of the stack package of FIG. 2.

FIG. 6 is a view of a modification of the stack package of FIG. 2, and the same references as FIG. 2 designate the same parts.

In the modification of FIG. 6, four BGA PKGs 110A, 110B, 110C and 110D are stacked, and it will be appreciated from FIG. 6 that four or more BGA PKGs can be stacked if necessary. The description of the stacking method and the construction of the stack package of FIG. 6 will be omitted as being the same as the embodiment of FIG. 2.

Figure 7:
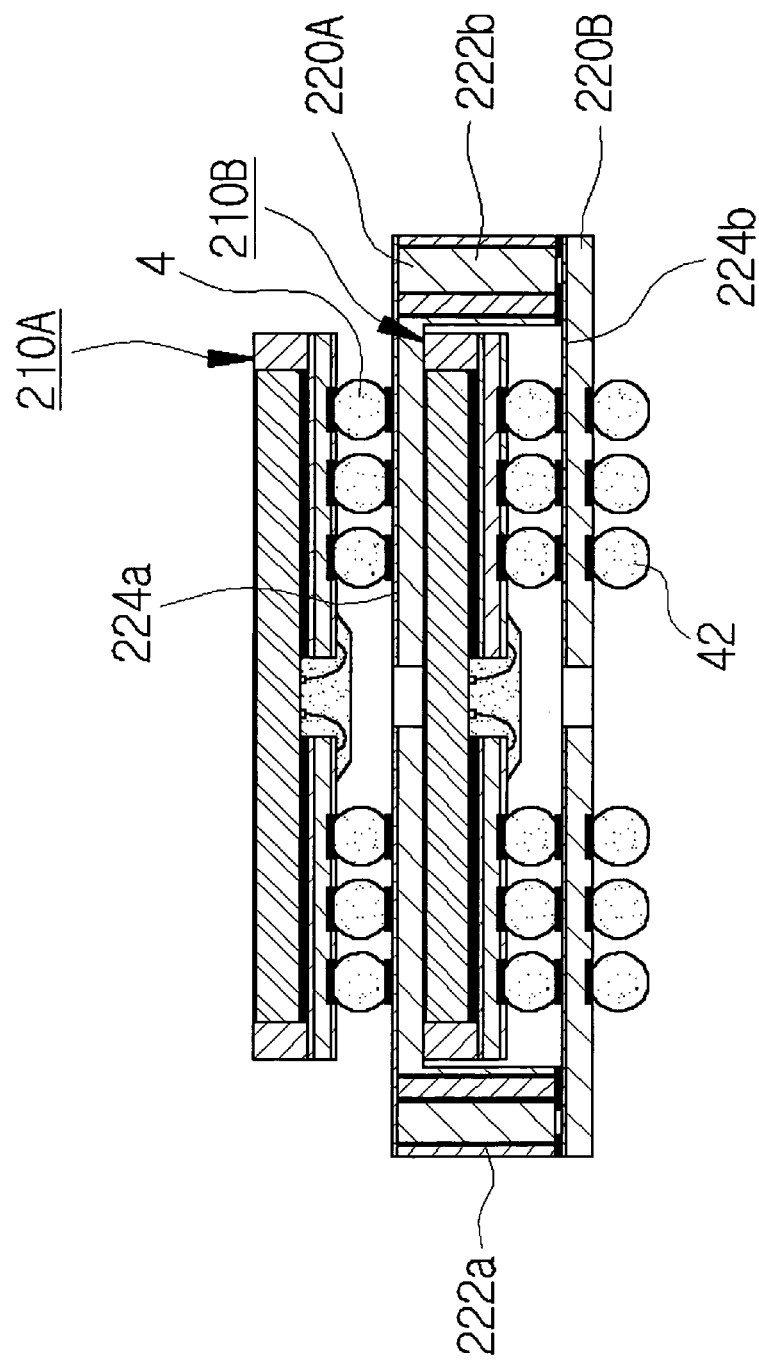
FIG. 7 is a view of a stack package according to a second preferred embodiment of the present invention.

FIG. 7 is a view of a stack package according to the second embodiment of the present invention. In FIG. 7, the same reference numerals as FIG. 1 designate the same parts as FIG. 1.

As shown in the drawing, also in the stack package according to the second embodiment, at least two or more BGA PKGs 210A and 210B described above referring to FIG. 1, which have been fabricated previously, are stacked.

First and second substrates 220A and 220B are prepared to stack the BGA PKGs 210A and 210B in order.

The first substrate 220A has rectangular protrusions 222a and 222b protruding integrally with both edges thereof in the downward direction, and the second substrate 220B is flat. It is preferable that the first and second substrates 220A and 220B are made of ceramic-based material having an insulating function. The reason is to achieve high speed of a semiconductor memory by facilitating emission of heat generated during using the high-speed memory. The first substrate 220A has an area to mount the BGA PKG 210A located on the upper portion, and a circuit pattern layer 224a for connecting electrically is formed on the corresponding portion of the BGA PKG 210A mounted on the first substrate 220A. The solder balls 4 of the BGA PKG 210 are fused on the circuit pattern layer 224a to allow a flow of electric signal. Furthermore, also the second substrate 220B has an area for mounting the BGA PKG 210B located on the lower portion, and a circuit pattern layer 224b for connecting electrically with the BGA PKG 210B is formed on the corresponding portion of the BGA PKG 210B mounted on the second substrate 220B.

After the BGA PKGs 210A and 210B are stacked, other solder balls 42 are fused on the lower surface of the second substrate 220B for inputting and outputting of signals of the stacked BGA PKGs 210A and 210B.

Figure 8:
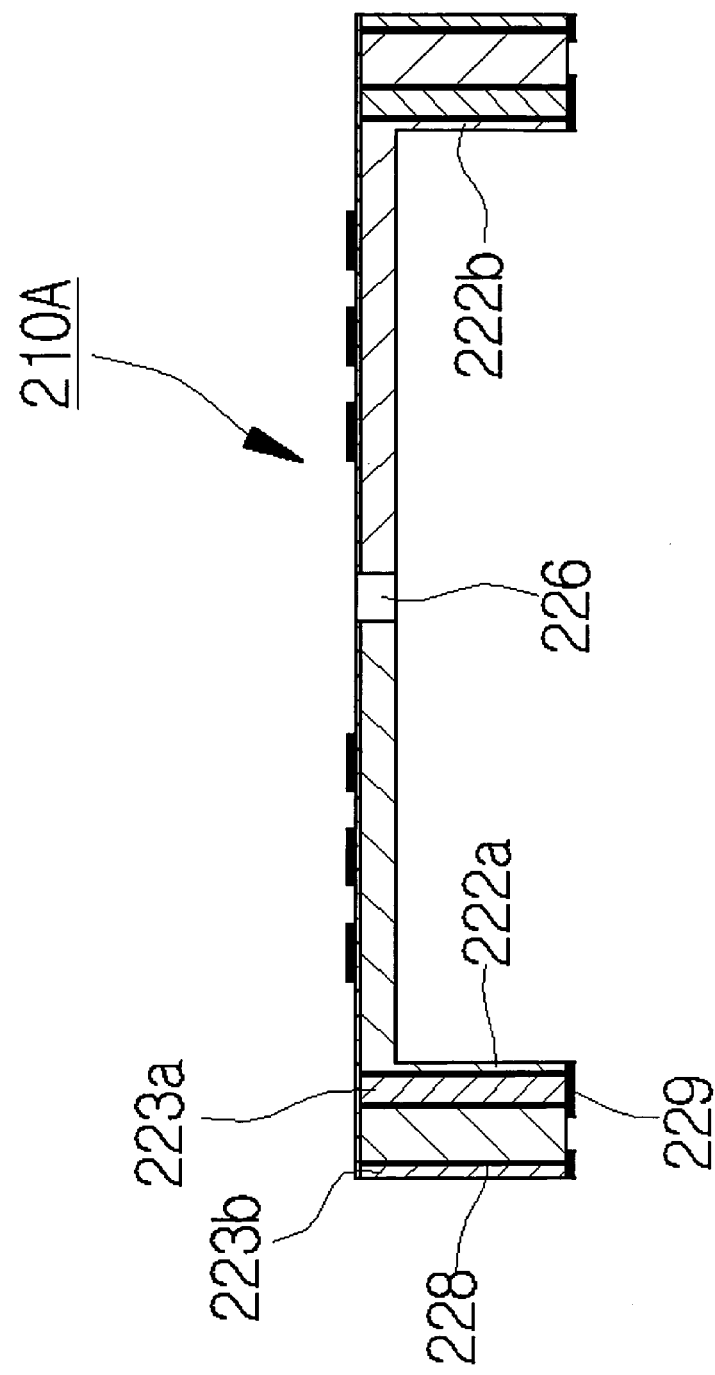
FIG. 8 is a view showing only a substrate(210A) applied to the stack package of FIG. 7.

FIG. 8 is a view showing only the first substrate 220A applied to the stack package of FIG. 7.

The first substrate 220A has an opening 226 formed in the center thereof, and protrusions 222a and 222b formed on both edges thereof. Moreover, the protrusions 222a and 222b respectively have first and second holes 223a and 223b perforating the protrusions 222a and 222b in the longitudinal direction.

The first holes 223a completely perforate the protrusions 222a and 222b, and the second holes 223b is in a semicircular groove shape if being seen from the outer section of the protrusions 222a and 222b. Additionally, the first and second holes 223a and 223b respectively have plated layers 228 of a good conductivity formed on the inner surface thereof so as to allow the flow of electrical flow of the BGA PKGs 210A and 210B.

The protrusions 222a and 222b have pads 229 respectively disposed on the lower surface thereof, and the pads 229 extend from the plated layers 228 formed along the first and second holes 223a and 223b. The pads 229 allow the flow of electrical flow with the BGA PKG 210B mounted on the circuit pattern layer 224b of the second substrate 220B in contact with the pads 229.

The connection structure by the pads 229 allows a short electric signal line between the first and second substrates 220A and 220B so as to improve mechanical or electrical reliability. It is preferable that the first and second holes 222a and 222b are filled with solders.

Figure 9:
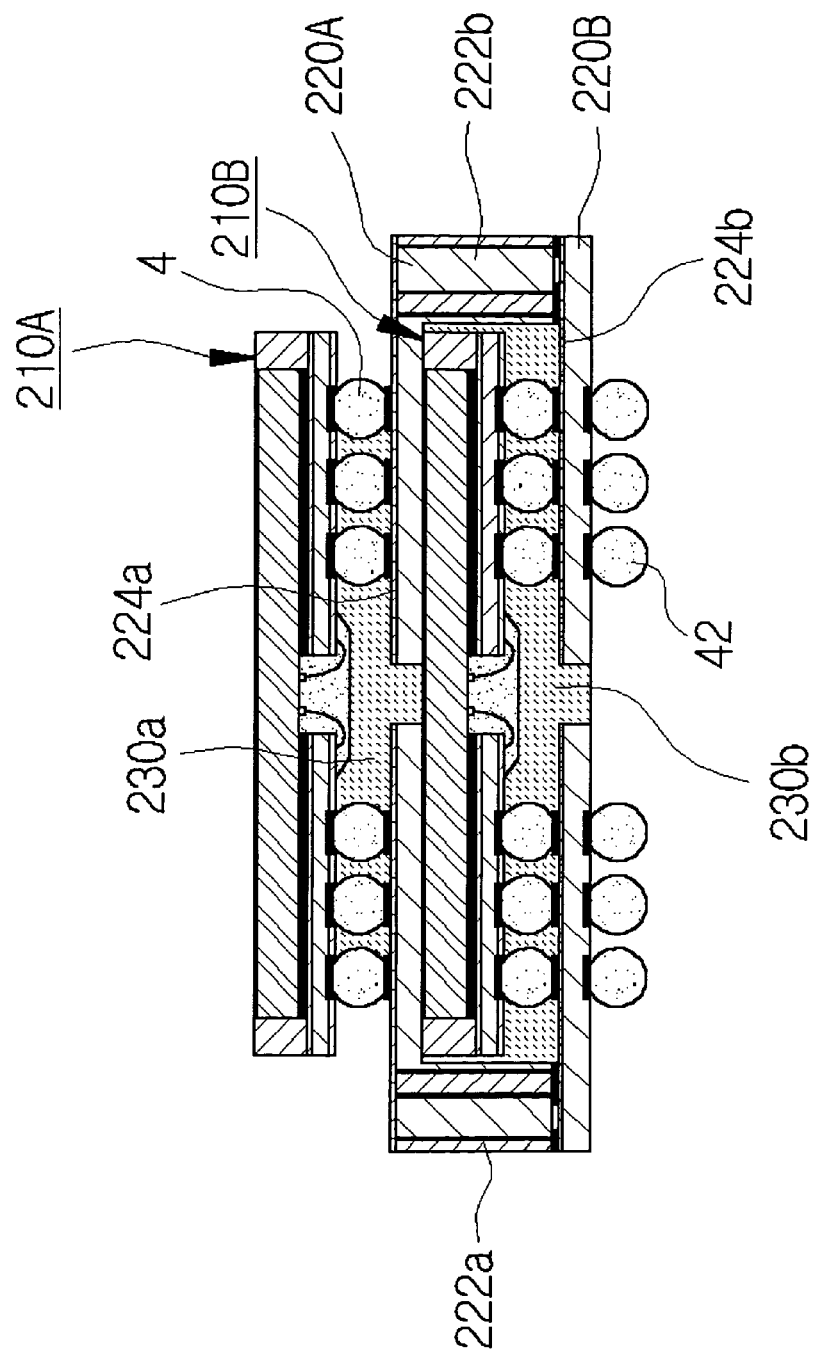
FIG. 9 is a view of a modification of FIG. 7.

FIG. 9 is a view of a modification of the stack package of FIG. 7.

As shown in the drawing, there is only a difference between the second embodiment of FIG. 7 and the modification in that under fills 230a and 230b made by using insulating material are located between the first and second substrates 220A and 220B and the BGA PKGs 210A and 210B.

The under fills 230a and 230b can keep bonding force between the stacked BGA PKGs 210A and 210B and allow a reliable signal control by protecting the solder balls 4 for inputting and outputting signals. Description of other structures of the modification will be omitted as being the same as the second embodiment.

Figure 10:
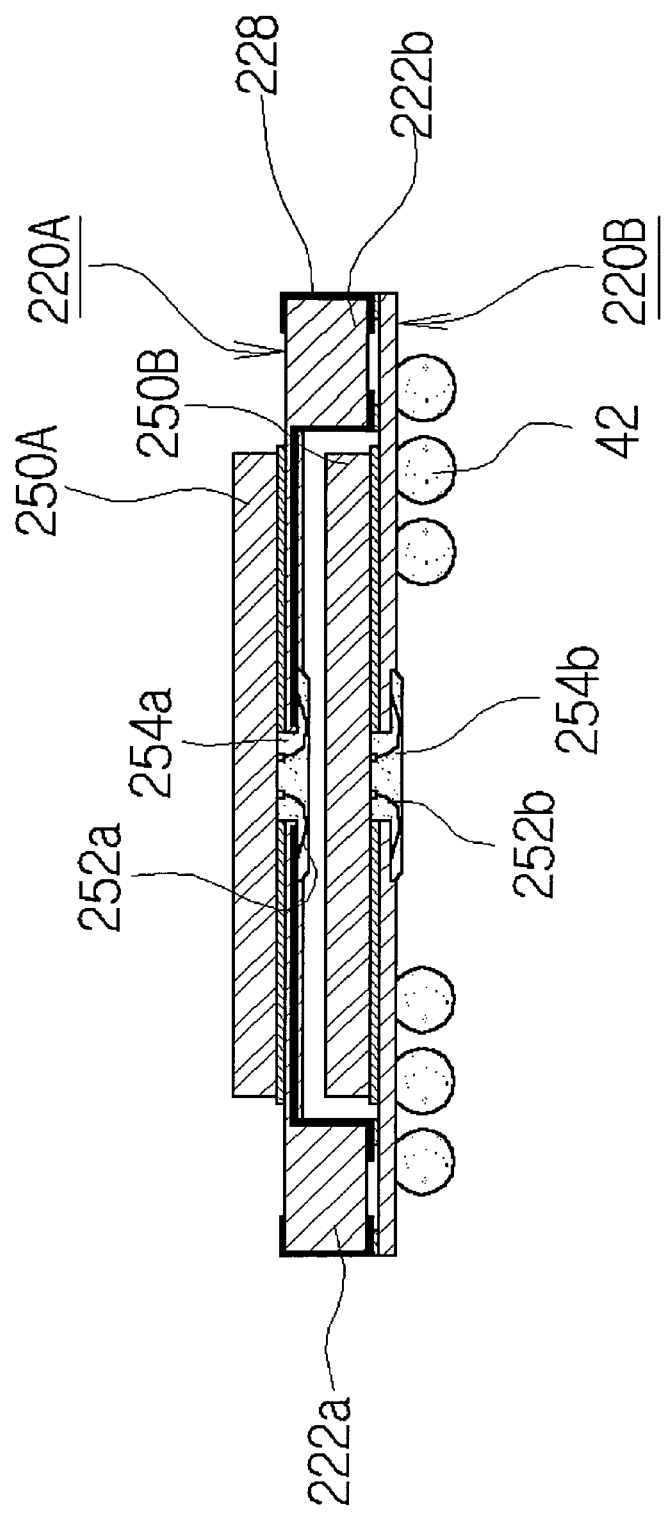
FIG. 10 is a view of another modification of FIG. 7.

FIG. 10 is a view of another modification of FIG. 7., showing a stack package using bare chips.

The second modification is different from the second embodiment of FIG. 7 in that not the BGA PKGs but bare chips 250A and 250B are mounted and stacked using the first and second substrates 220A and 220B of FIG. 7, and in that the plated layers 228 are formed to allow a signal connection without holes formed in the protrusions 222a and 222b of the first substrate 220A.

In the second modification, the first and second chips 250A and 250B are mounted on the upper surfaces of the first and second 220A and 220B, and connected with wires 252a and 252b to flow electric signal of the first and second chips 250A and 250B to the substrates 220A and 220B. To protect the wire-connected portions, the wire-connected portions are molded with the insulating material(254a and 254b designate the molded portions). In a state in which the first and second chips 250A and 250B are mounted on the first and second 220A and 220B, the first and second substrates 220A and 220B are stacked so that the stack package using the bare chips are fabricated. Description of other structures of the second modification will be omitted as being the same as the second embodiment of FIG. 7.

Figure 11:
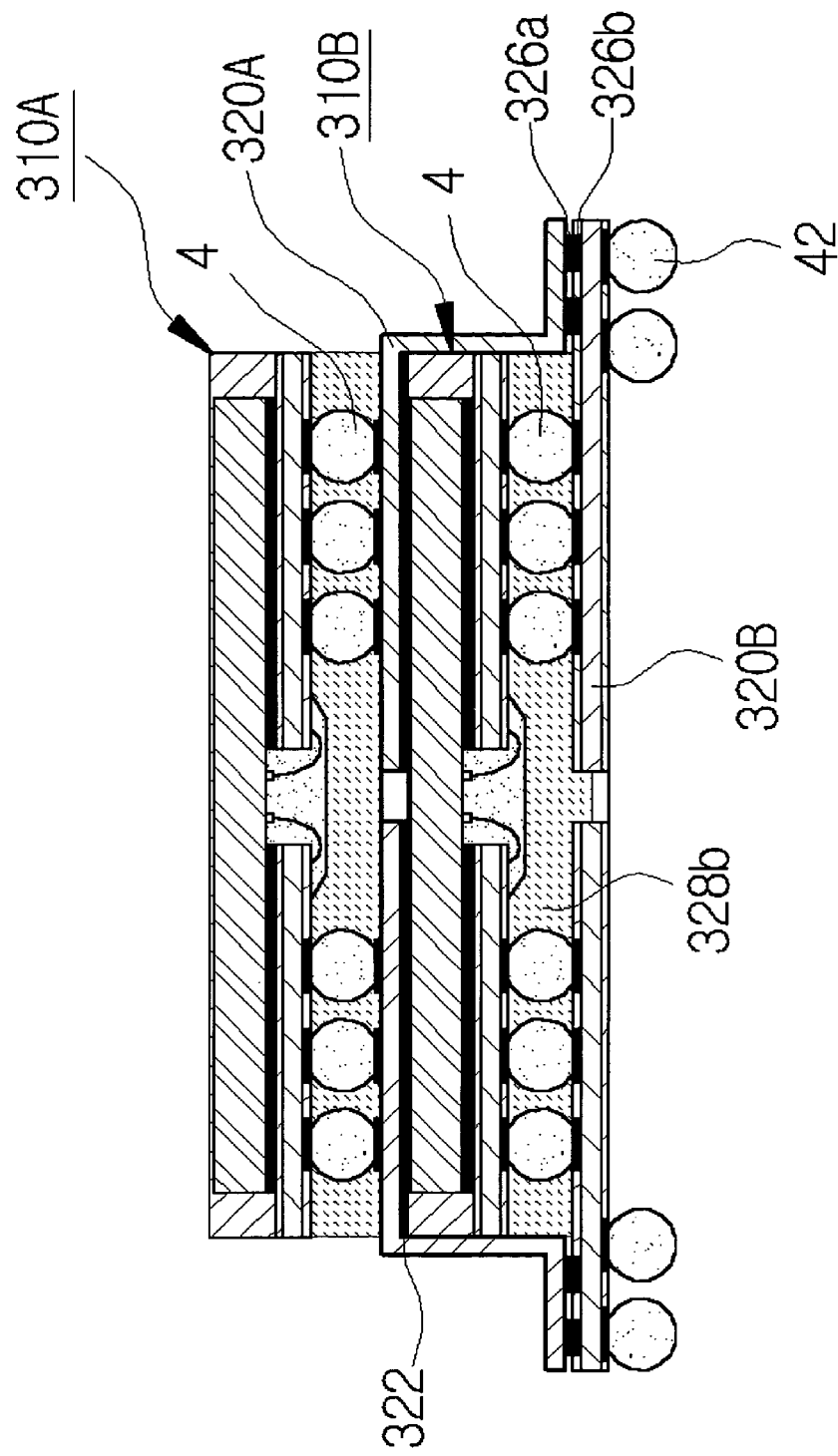
FIG. 11 is a view of a stack package according to a third preferred embodiment of the present invention.

FIG. 11 is a view of a stack package according to the third preferred embodiment of the present invention. In FIG. 11, the same reference numerals as FIG. 1 designate the same parts as FIG. 1.

Also, in this embodiment, at least two or more BGA PKGs 310A and 310B described above referring to FIG. 1, which have been fabricated previously, are stacked, and have a flexible substrate 320A. The flexible substrate 320A is mounted between the BGA PKGs 310A and 310B to fix the stacked BGA PKGs 310A and 310B and to electrically connect electric signals of the BGA PKGs 310A and 310B.

The BGA PKG 310A stacked on the flexible substrate 320A is bonded by reflow of the solder balls 4 disposed on the BGA PKG 310A, and the BGA PKG 310B stacked on the lower portion of the flexible substrate 320A is bonded by an adhesive 322.

Furthermore, it is preferable that the substrate 320A has flexibility, and a circuit pattern layer(not shown) is mounted on the surface of the flexible substrate 320A to connect the electric signals of the BGA PKGs 310A and 310B.

Both sides of the flexible substrate 320A are bended and in contact with side walls of the BGA PKG 310B located on the lower portion thereof, and then, both ends of the flexible substrate 320A are electrically connected with a rigid substrate 320B, which is mounted on the lowermost portion, and on which the BGA PKG 310B is mounted.

The connection of the electric signals between the flexible substrate 320A and the rigid substrate 320B is achieved by conductive pads 326a and 326b, which are formed on contact surfaces of the substrates 320A and 320B.

Differently from the flexible substrate 320A, it is preferable that the rigid substrate 320B has rigidity, and has a circuit pattern layer(not shown) disposed on the surface thereof to be electrically connected with the BGA PKGs 310A and 310B.

Moreover, solder balls 42 are fused on the rigid substrate 320B for inputting and outputting the electric signals.

In this embodiment, reference numerals 328a and 328b designate under fills formed by using insulating materials to increase bonding force of the BGA PKGs 310A and 310B stacked on the flexible substrate 320A and the rigid substrate 320B.

Figure 12A:
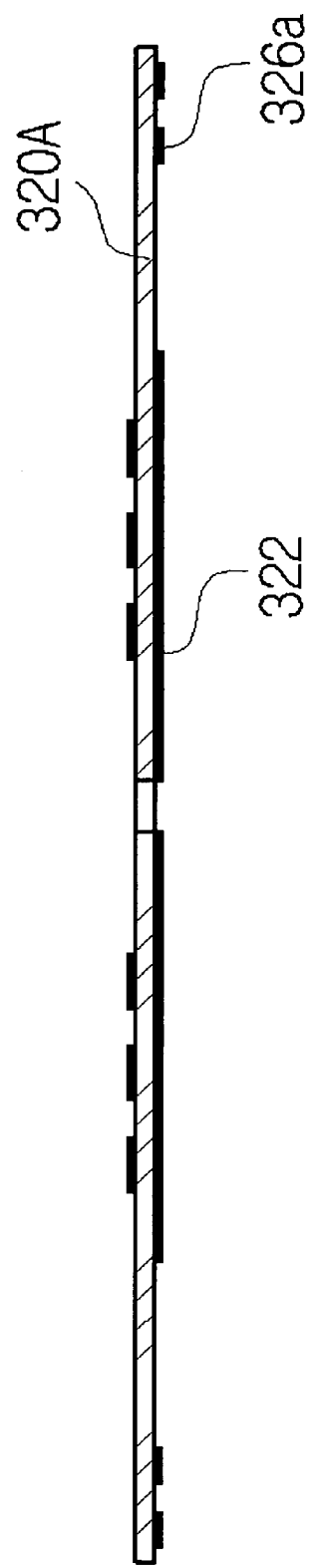
Figure 12B:
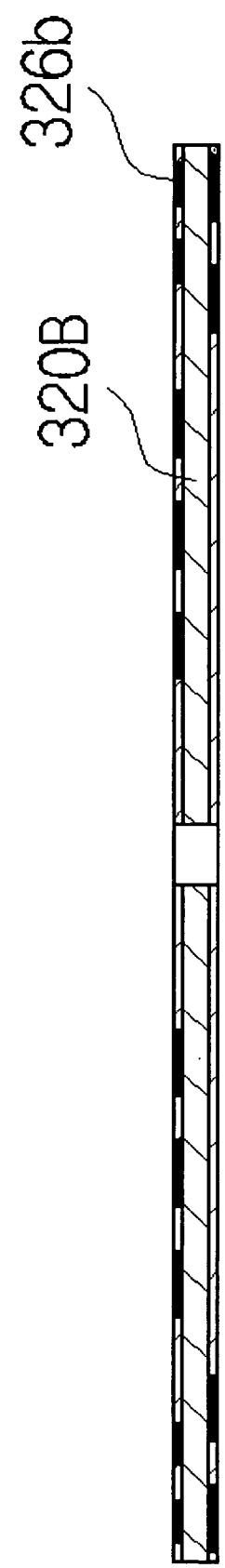
Figure 12D:
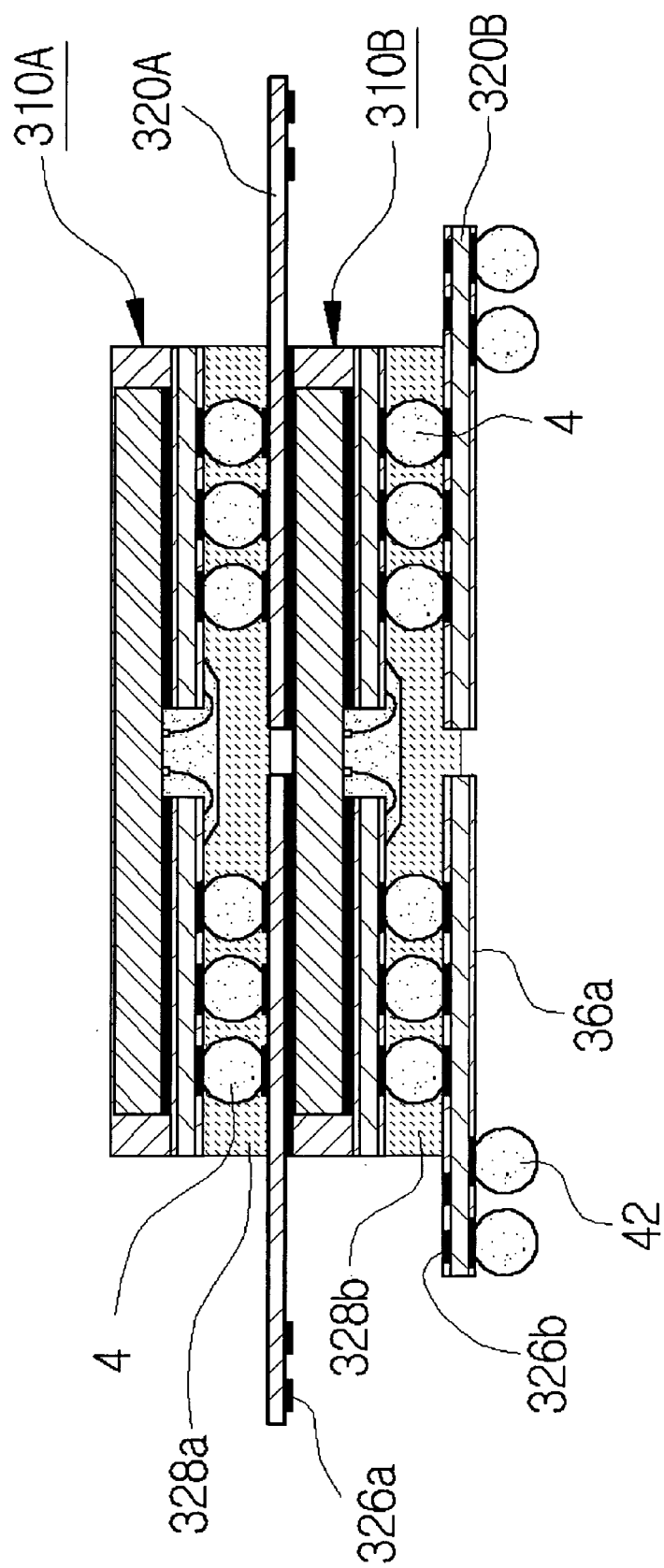

FIGS. 12a and 12d are views showing fabricating processes of the stack package of FIG. 11 in order.

FIG. 12a shows only the flexible substrate 320A, and the flexible substrate 320A has flexibility to be bended. In the drawing, reference numeral 322 designates an adhesive.

FIG. 12b shows only the rigid substrate 320B, and the rigid substrate 320B has rigidity to support the stacked BGA PKGs.

The substrates 320A and 320B have areas for mounting the BGA PKGs 310A and 310B, and the circuit pattern layers(there are no reference numerals in drawings) formed on the surfaces thereof to connect the electric signals of the BGA PKGs. Additionally, the substrates 320A and 320B have the pads 326a and 326b for connecting the electric signals when being stacked.

FIG. 12c shows a state in which the BGA PKGs 310A and 310B are mounted on the upper surfaces of the flexible substrate 320A and the rigid substrate 320B. The BGA PKGs 310A and 310B mounted on the upper surfaces of the flexible substrate 320A and the rigid substrate 320B fuse the solder balls 4 onto the flexible substrate 320A and the rigid substrate 320B by reflowing the solder balls 4 disposed on the BGA PKGs 310A and 310B, so that the substrates 320A and 320B and the BGA PKGs 310A and 310B are electrically connected. At this time, it is preferable that the under fills 328a and 328b made by using the insulating material are formed between the substrates 320A and 320B and the BGA PKGs 310A and 310B to increase the bonding force of the BGA PKGs 310A and 310B mounted on the flexible substrate 320A and the rigid substrate 320B.

FIG. 12d shows a structure in which the BGA PKGs 310A and 310B are stacked on the flexible substrate 320A and the rigid substrate 320B in order.

In such stacked condition, the outer portions of the flexible substrate 320A, i.e., both sides extending long to the outside of the BGA PKG 310A, are bended to be in contact with the side walls of the BGA PKG 310A, and the bended ends are connected with the upper surface of the rigid substrate 320B and contact with the rigid substrate 320B by the pads 326a and 326b interposed therebetween, so that the substrates 320A and 320B and the BGA PKGs 310A and 310B are electrically connected with each other. After that, the stack package according to the third embodiment of the present invention can be finished by fusing the solder balls 42 onto the lower portion of the rigid substrate 320B.

Figure 13:
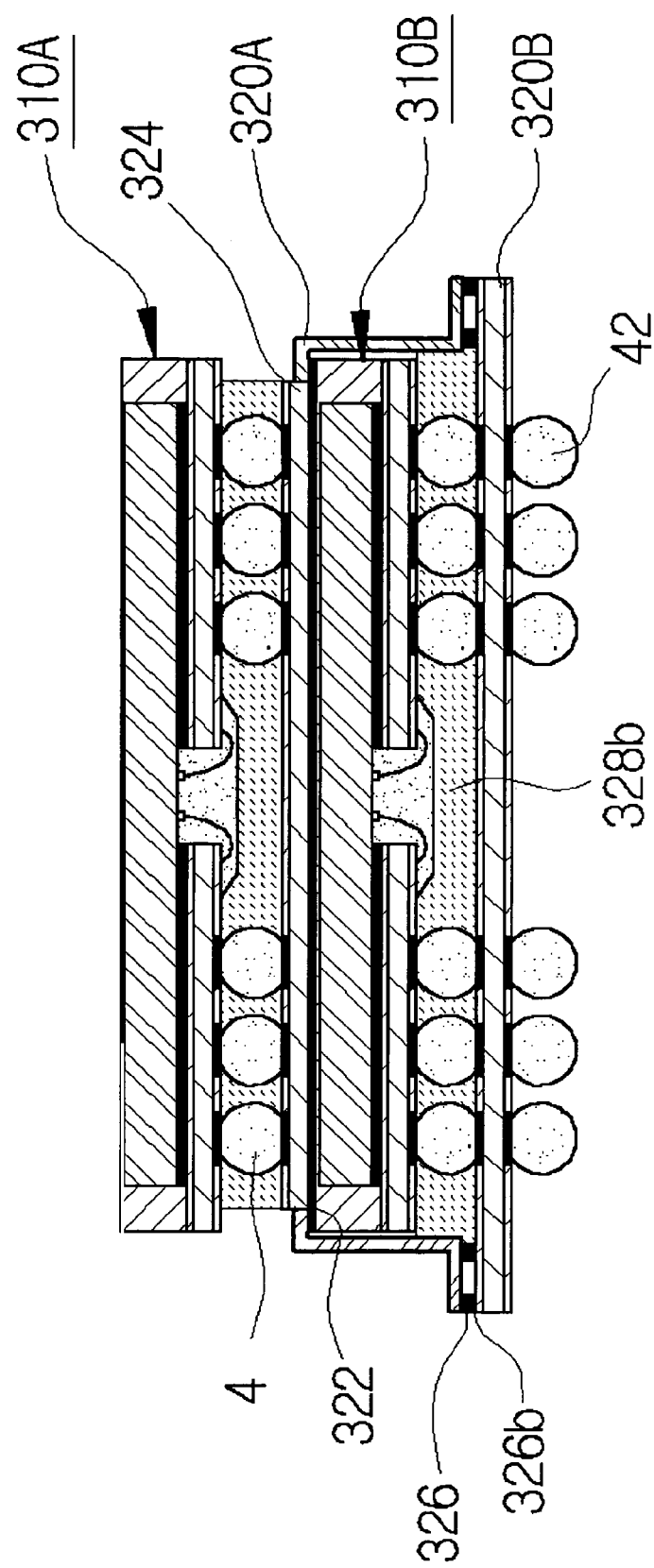
FIG. 13 is a view of a modification of the stack package of FIG. 11.

FIG. 13 is a view of a modification of the stack package of FIG. 11. In FIG. 13, the same reference numerals as FIG. 11 designate the same parts as FIG. 11.

As shown in the drawing, the stack package according to the modification is different from the embodiment of FIG. 11 in that a rigid material 324 is mounted on an area corresponding to the BGA PKG 310A mounted on the flexible substrate 320A.

That is, in this modification, the rigid material 324 is mounted on a predetermined area(area corresponding to the BGA PKG 310A) of the flexible substrate 320A. The reason is to more stably support the BGA PKG 310A mounted on the flexible substrate 320A. The rigid material 324 is generally made of synthetic resin. Description of other constructions and fabricating processes will be omitted as being the same as the stack package of FIG. 11.

Figure 14:
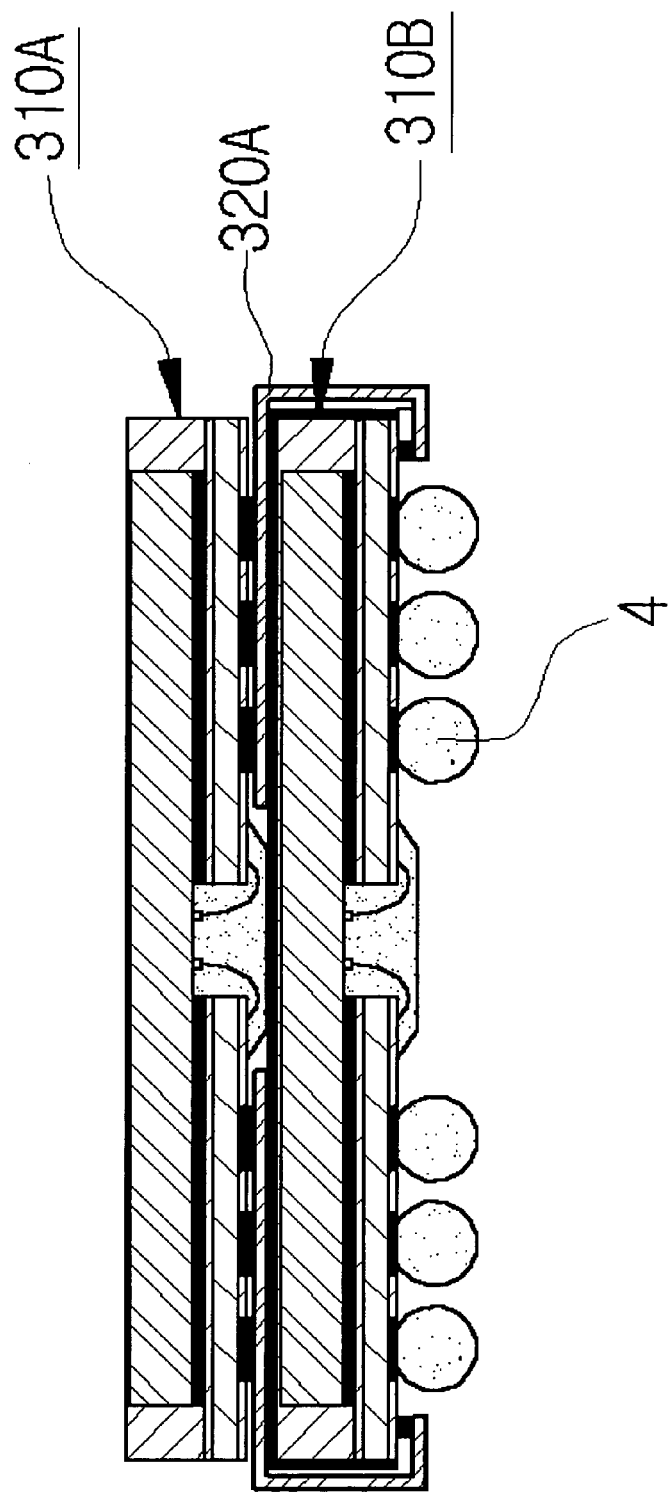
FIG. 14 is a view of another modification of the stack package of FIG. 11.

FIG. 14 is a view of the second modification of the stack package of FIG. 11. Description of the same constructions as FIG. 11 will be omitted to escape duplicate description.

The second modification is different from the embodiment of FIG. 11 in that only the flexible substrate 320A is used without the rigid substrate 320B to directly connect the electric signal to the lower portion of the BGA PKG 310B stacked on the lower portion thereof, and in that the solder balls 4, which are disposed on the BGA PKG 310A stacked on the upper portion of the flexible substrate 320A in the embodiment of FIG. 11, are not used.

By removing the rigid substrate 320B and the solder balls 4 of the BGA PKG 310A, which are used in the third embodiment, the stack package can be compact by reducing the entire height, control signals more rapidly by removing several parts, and reduce material costs. Description of other constructions will be omitted as being the same as the third embodiment of FIG. 11.

Figure 15A:
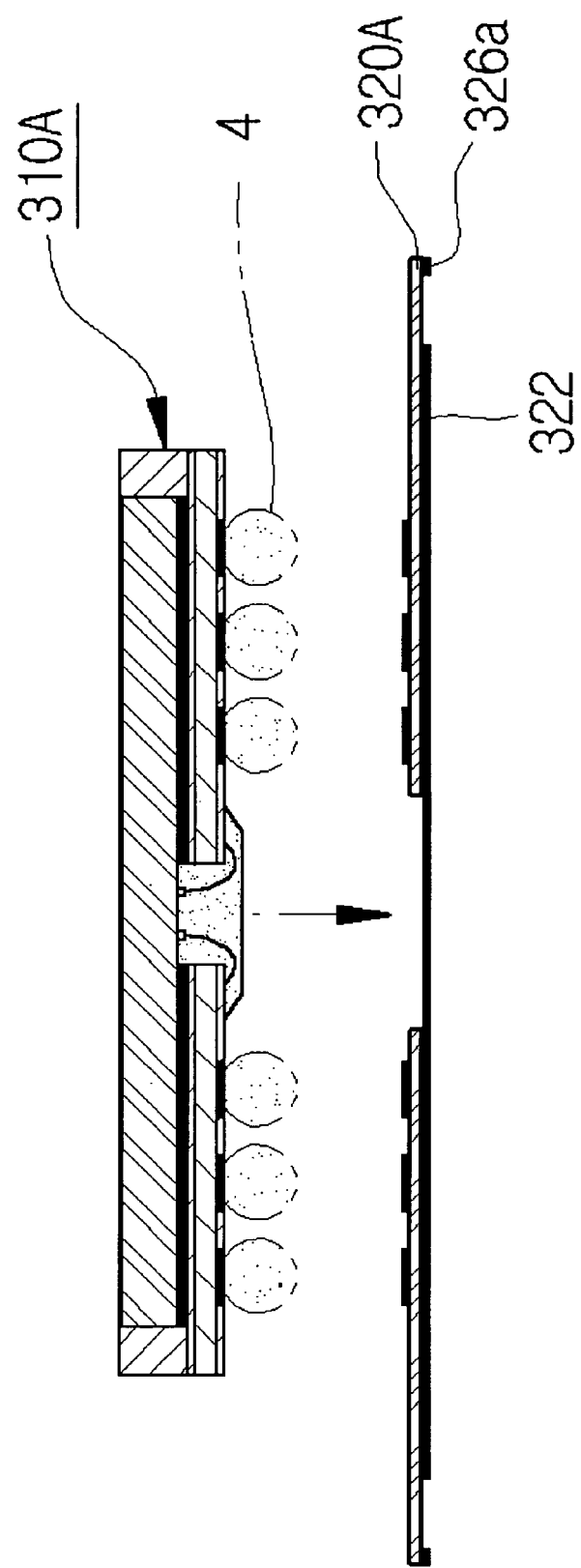
FIGS. 15a to 15c are views showing manufacturing processes of the stack package of FIG. 14 in order.
Figure 15B:
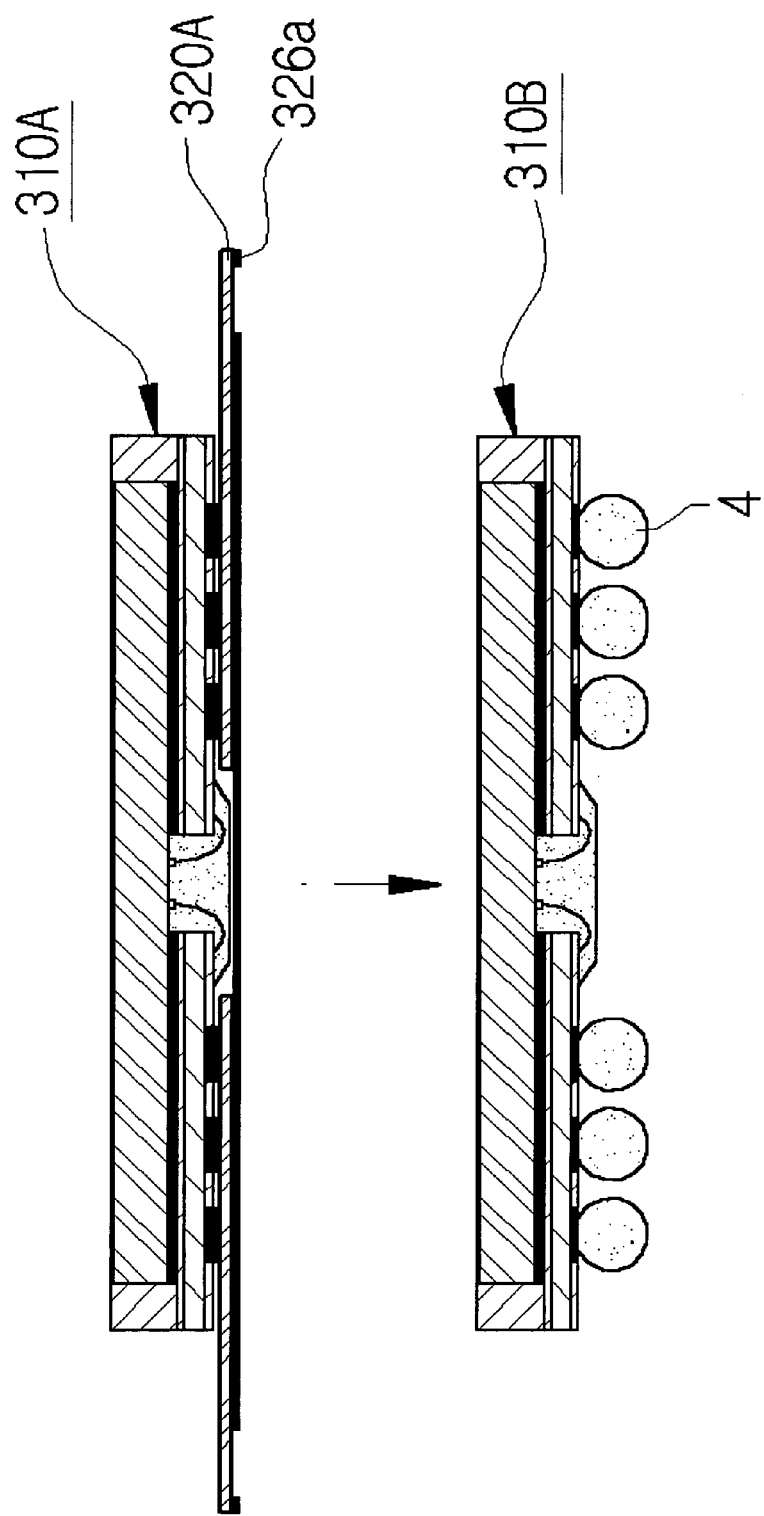
Figure 15C:
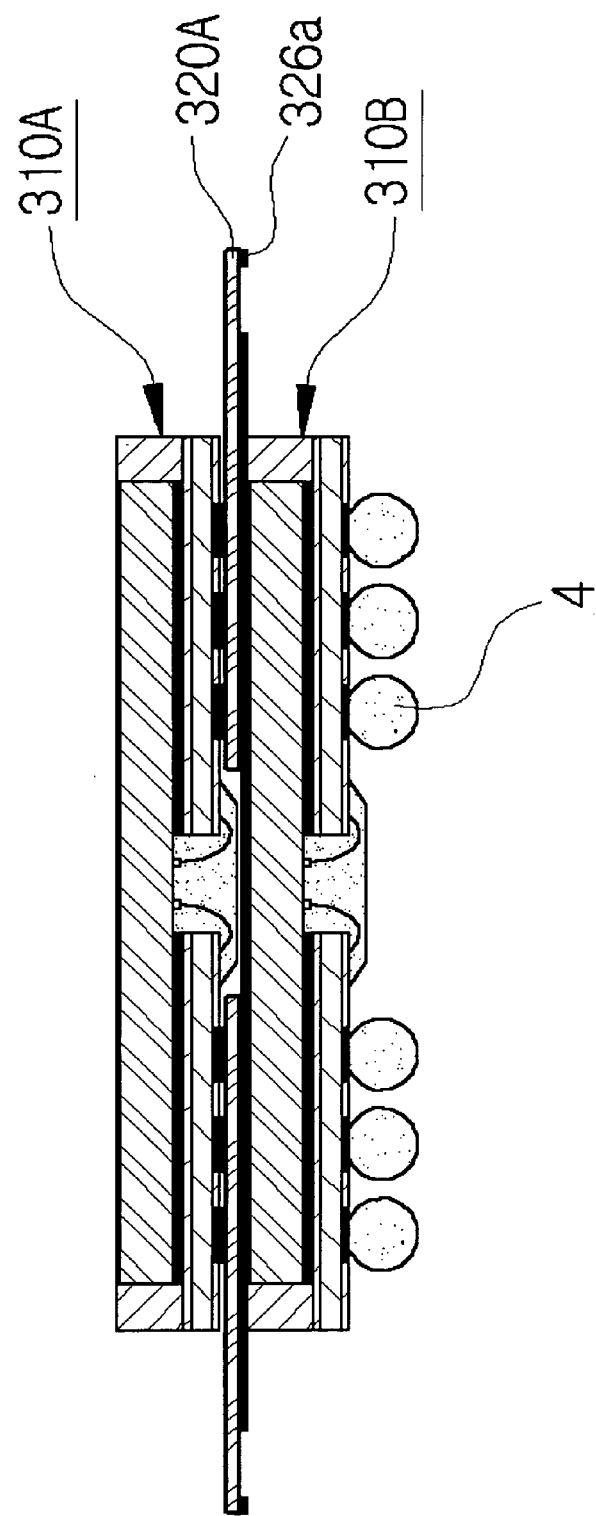

FIGS. 15a to 15c are views showing fabricating processes of the stack package according to the modification of FIG. 14 in order.

As shown in FIG. 15a, first, the BGA PKG 310A, which does not have the solder balls 4, is mounted on the flexible substrate 320A, and then, the flexible substrate 320A is stacked on the upper surface of the BGA PKG 310B as shown in FIGS. 15b and 15c.

After the stacking, both ends of the flexible substrate 320A are bended in contact with the side surface and the lower portion of the BGA PKG 310B stacked on the lower portion of the flexible substrate 320A(see FIG. 14), and electrically connected to the lower portion of the BGA PKG 310B.

Figure 16:
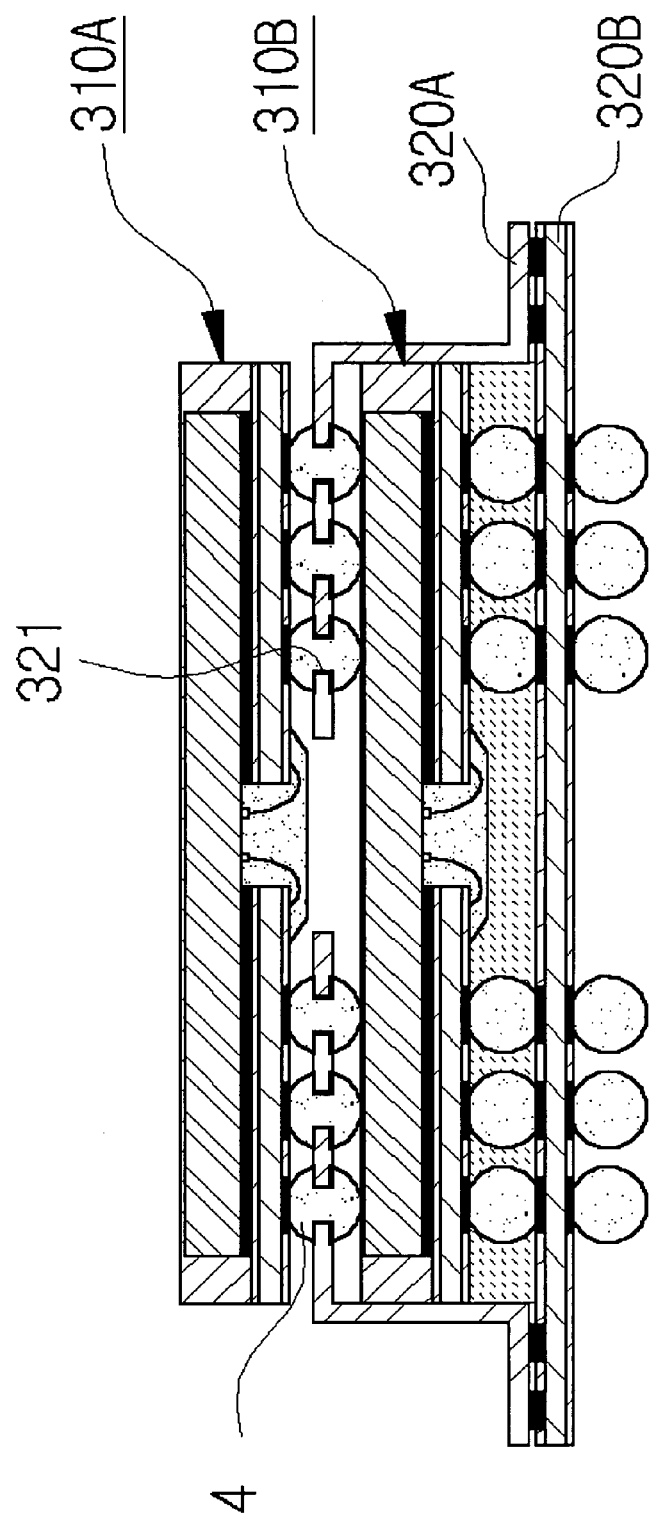
FIG. 16 is a view of a further modification of the stack package of FIG. 11.

FIG. 16 is a view of the third modification of the stack package of FIG. 11. In FIG. 16, the same reference numerals as the FIG. 11 designate the same parts as FIG. 11.

The third modification is different from the third embodiment in that connection holes 321 are formed in portions corresponding to the solder balls 4 of the BGA PKG 310A mounted on the flexible substrate 320A, and the solder balls 4 of the BGA PKG 310A are inserted and fused into the connection holes 321 for the connection of the electric signals.

The insertion and fusion of the solder balls 4 through the connection holes 321 can be carried out by a reflow process.

Description of other constructions and fabricating method will be omitted as being the same as the third embodiment of FIG. 11.

Figure 17:
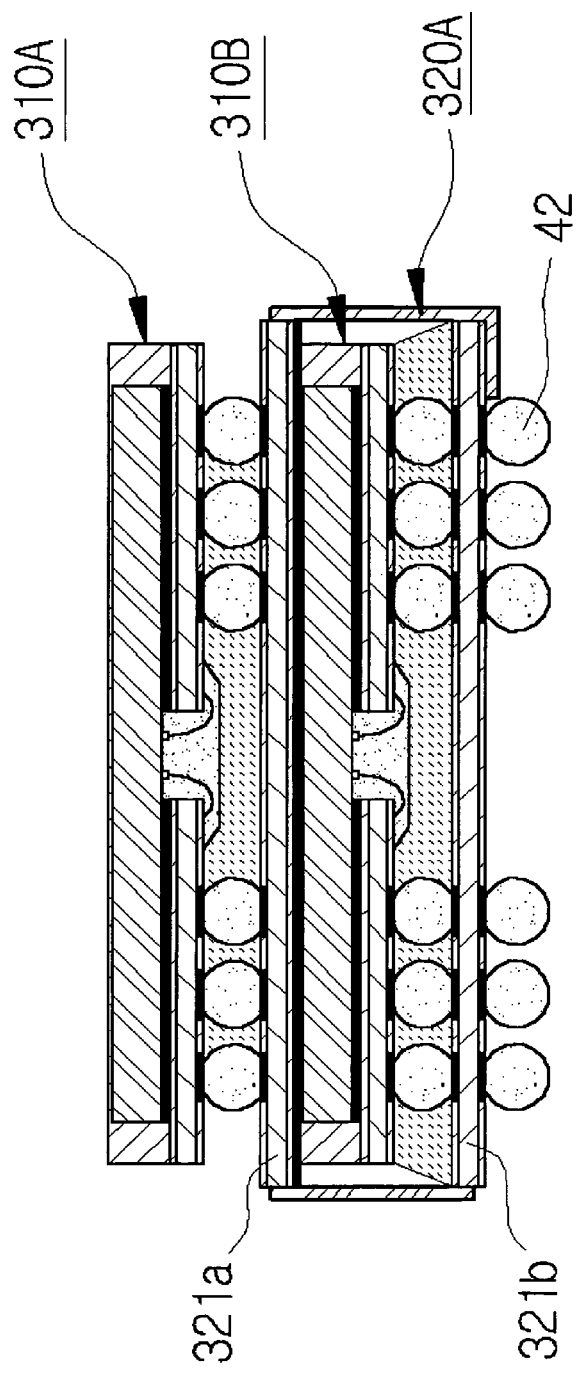
FIG. 17 is a view of a stack package according to a fourth preferred embodiment of the present invention.

FIG. 17 is a view of a stack package according to the fourth embodiment of the present invention. In FIG. 17, the same reference numerals as the above embodiments designate the same parts.

As shown in the drawing, in the stack package according to the fourth embodiment, only the flexible substrate 320A, which has an area for mounting both BGA PKGs 310A and 310B, is used. Referring to FIGS. 18a to 18d, the stack package will be described in more detail.

FIGS. 18a to 18d are views showing fabricating processes of the stack package of FIG. 17 in order.

FIG. 18a shows the flexible substrate 320A, for mounting the stacked BGA PKGs 310A and 310B at a predetermined interval. On the flexible substrate 320A, rigid materials 321a and 321b are mounted integrally only to the areas where the BGA PKGs 310A and 310B are mounted, to support the BGA PKGs 310A and 310B more reliably. The flexible substrate 320A has a common circuit pattern layer(not shown) for signal connection. Moreover, it is preferable that the solder balls 42, which are located at the lowermost position when the stack package is completed, are previously fused onto the flexible substrate 210A, and the adhesive 322 is adhered onto the flexible substrate 320A beforehand.

Figure 18B:
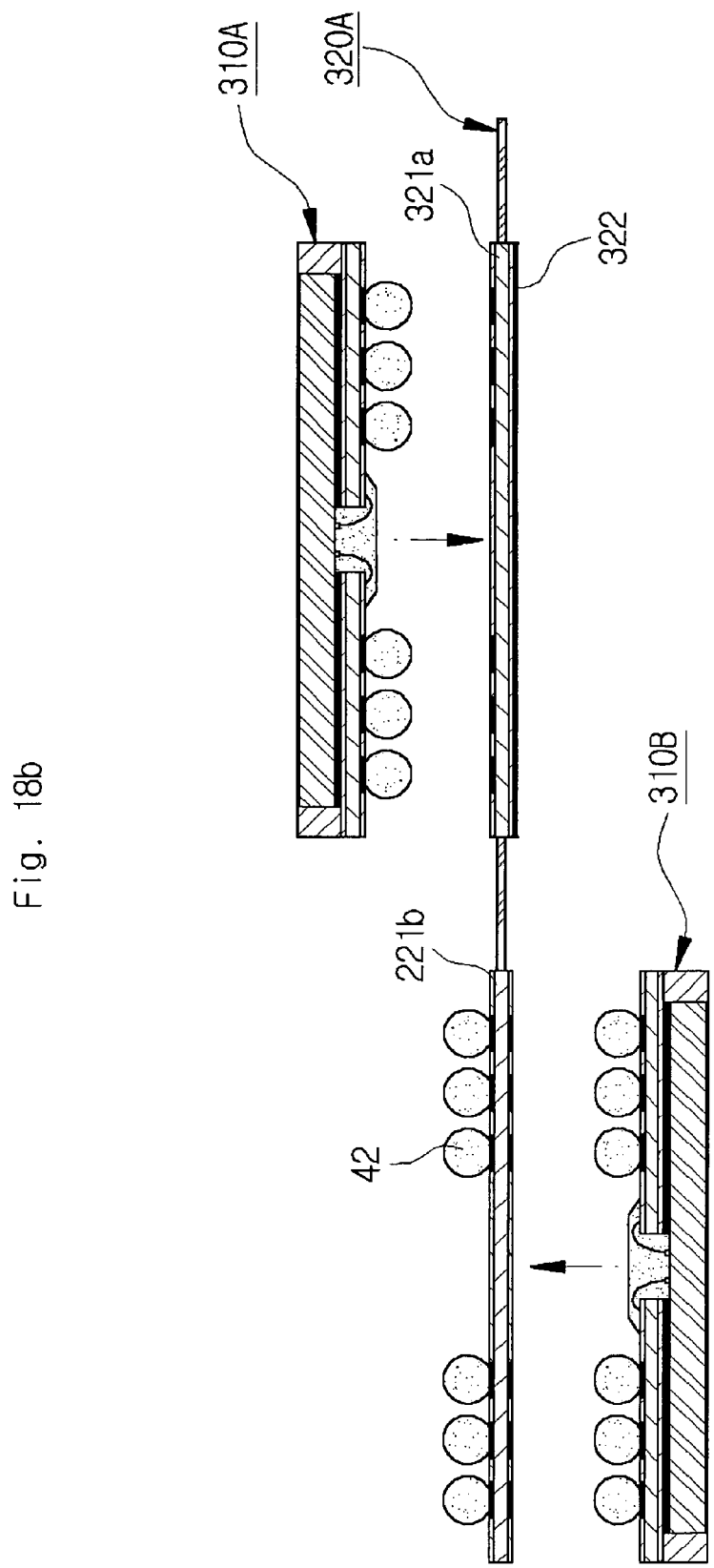
Figure 18D:
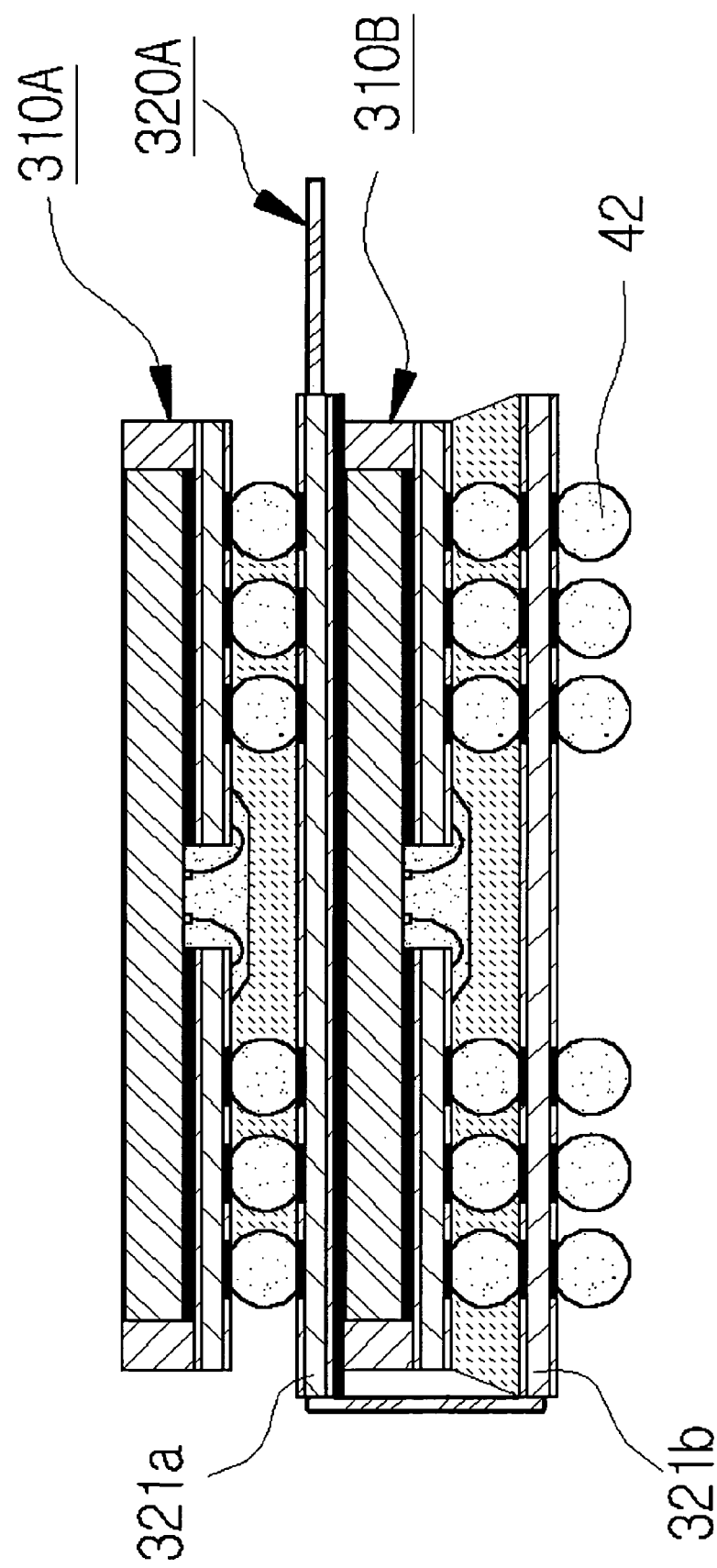

FIGS. 18b and 18c show states in each of which the BGA PKGs 310A and 310B are mounted on the rigid materials 321a and 321b of the flexible substrate 320A in the opposite directions to each other. After the BGA PKGs 310A and 310B are mounted on the flexible substrate 320A, as shown by an arrow of FIG. 18c, the flexible substrate 320A is bended, and bonded with the adhesive 322, and then, stacked as shown in FIG. 18d. After that, an end of the flexible substrate 320A extending to the outside is bended to be electrically connected with the BGA PKG 310B located on the lower portion thereof, and thereby, the stack package is finished as shown in FIG. 17.

At this time, when the end of the flexible substrate 320A is in contact with the BGA PKG 320B located on the lower portion thereof to be electrically connected with the BGA PKG 320B, as shown in FIG. 17, it can be located on the lower surface of the BGA PKG 310B. In this embodiment, the BGA PKGs are mounted on the substrate, but it will be appreciated that they can be mounted on bare chips in place of the substrate.

FIG. 19 is a view of a modification of the stack package of FIG. 17. In FIG. 17, the same reference numerals as FIG. 17 designate the same parts as FIG. 17.

This modification is different from the fourth embodiment of FIG. 17 in that the bended end of the flexible substrate 320A is bonded on the surface of the rigid material 321b of the substrate 320A, and other constructions and fabricating method are the same as the fourth embodiment of FIG. 11.

Figure 20:
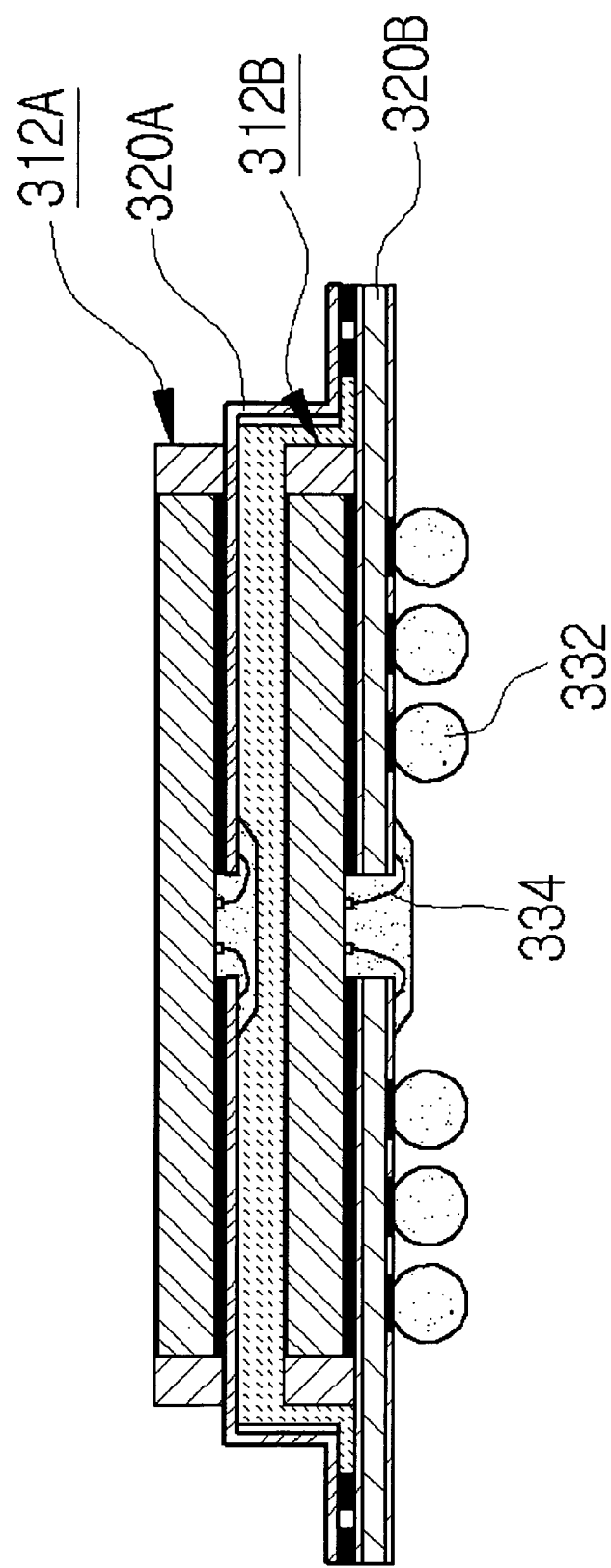
FIG. 20 is a view of a stack package according to a fifth preferred embodiment of the present invention.

FIG. 20 is a view of a stack package according to the fifth preferred embodiment of the present invention. In FIG. 20, the same reference numerals as the above embodiments designate the same parts.

As shown in the drawing, in the stack package according to the fifth preferred embodiment, not the BGA PKGs but the bare chips are stacked. The bare chips 312A and 312B are mounted on the flexible substrate 320A and the rigid substrate 320B respectively, and then, wires 334 are connected to allow the flow of signals between the substrates 320A and 320B and the bare chips.

The flexible substrate 320A and the rigid substrate 320B, on which the bare chips 312A and 312B are mounted, are stacked to form the stack package, and for the complete stack package, solder balls 332 are fused onto the lowermost portion of the rigid substrate 320B to transmit signals to the outside.

Figure 21B:
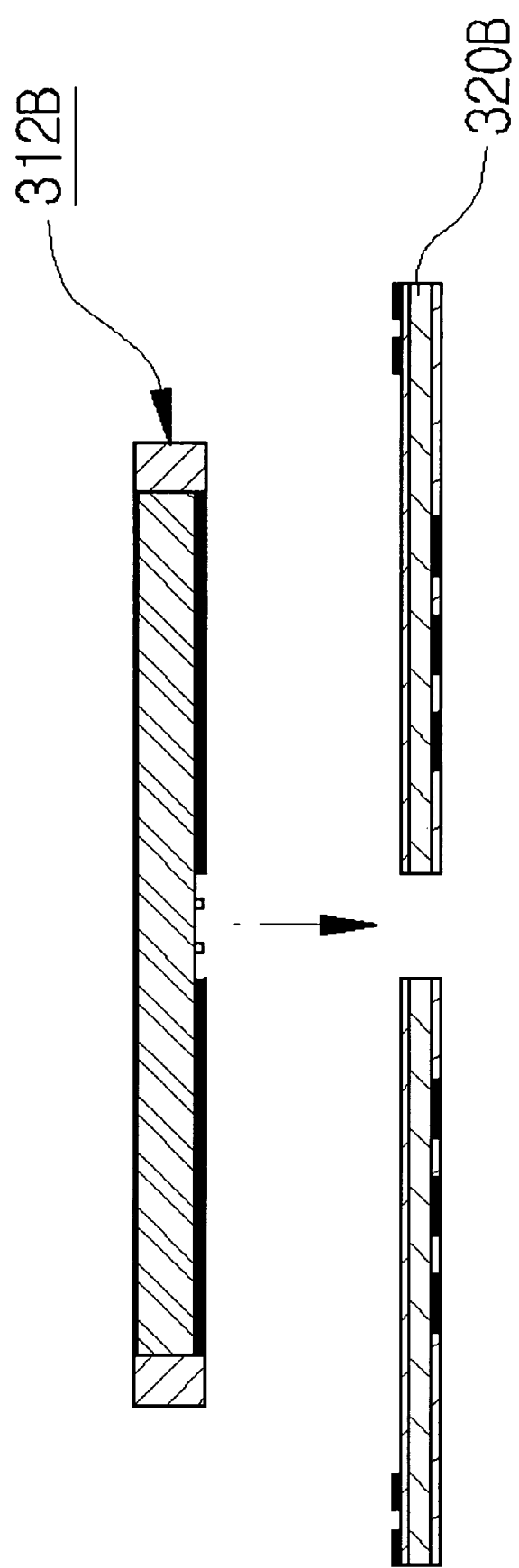
Figure 21C:
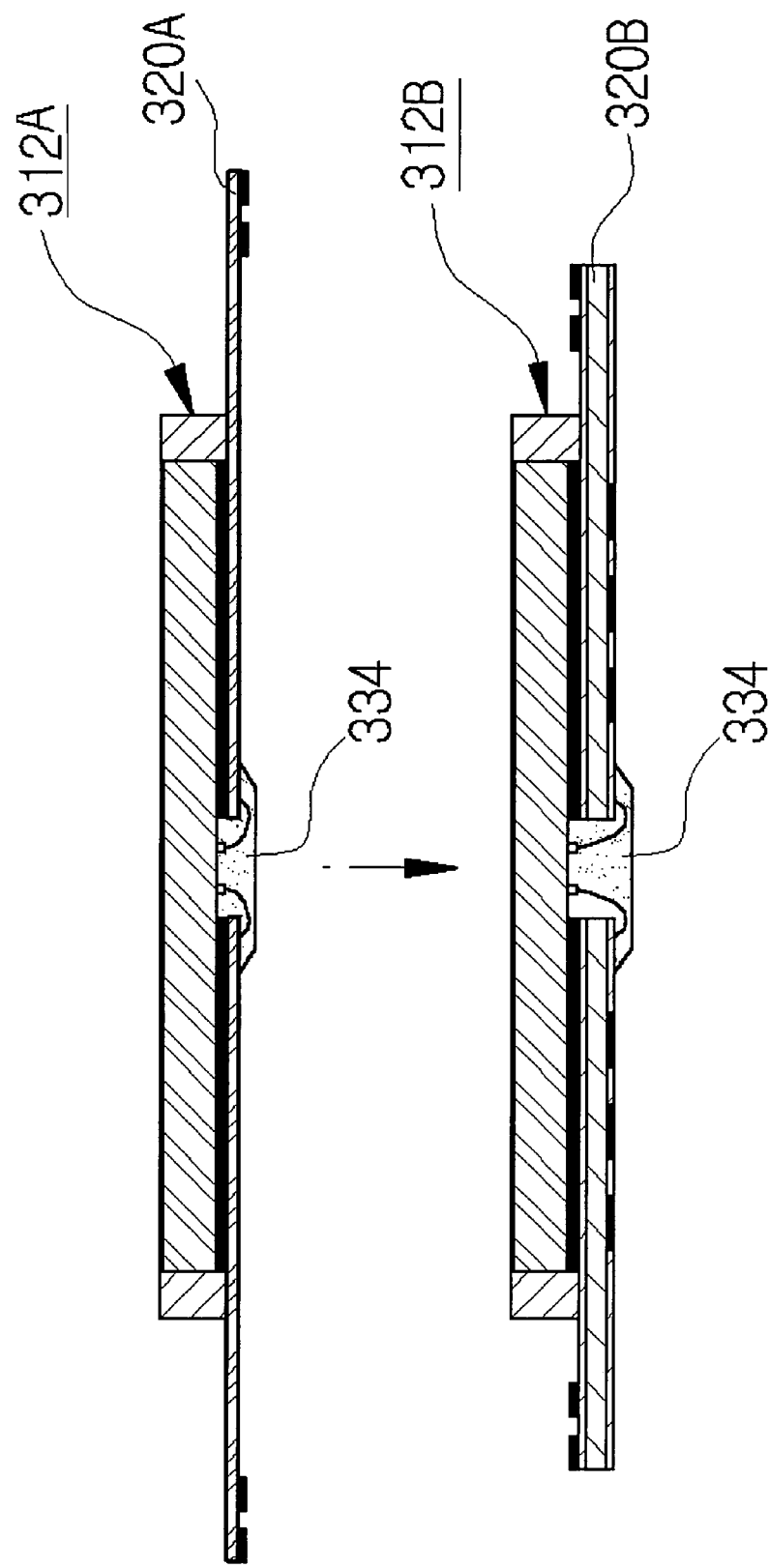

FIGS. 21a to 21c are views showing fabricating processes of the stack package of FIG. 20.

First, the flexible substrate 320A and the rigid substrate 320B are prepared. As shown in FIG. 21a, the previously prepared bare chip 312A is mounted on the upper surface of the flexible substrate 320A, and the other bard chip 312B is mounted on the upper surface of the rigid substrate 320B. The bare chips 312A and 312B mounted on the flexible substrate 320A and the rigid substrate 320B respectively are connected and bonded with the circuit pattern layers(not shown), which are mounted on the flexible substrate 320A and the rigid substrate 320B, using wires 334 to be electrically connected with the substrates 320A and 320B, and then, insulating materials are molded around the connected portions of the wires 334.

After the molding, as shown by an arrow of FIG. 21c, the flexible substrate 320A is stacked on the upper portion of the rigid substrate 320B, and both ends of the flexible substrate 320A are bended to be connected with the side walls of the bare chip 312A and the surface of the rigid substrate 320B to transmit the signals. Finally, when the solder balls 332 are fused on the lower portion of the rigid substrate 320B, the stack package shown in FIG. 20 is finished.

Figure 22:
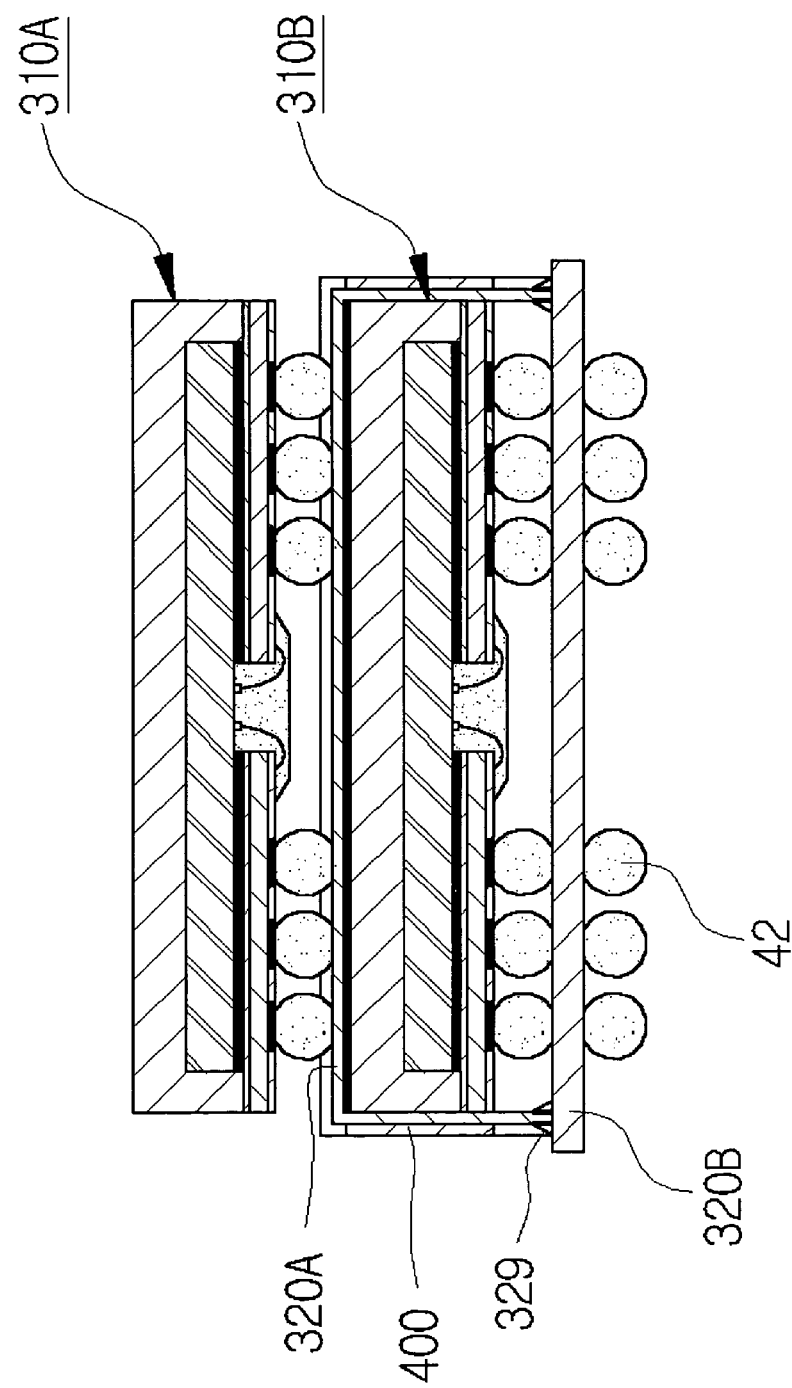
FIG. 22 is a view of a stack package according to a sixth preferred embodiment of the present invention.
Figure 23A:
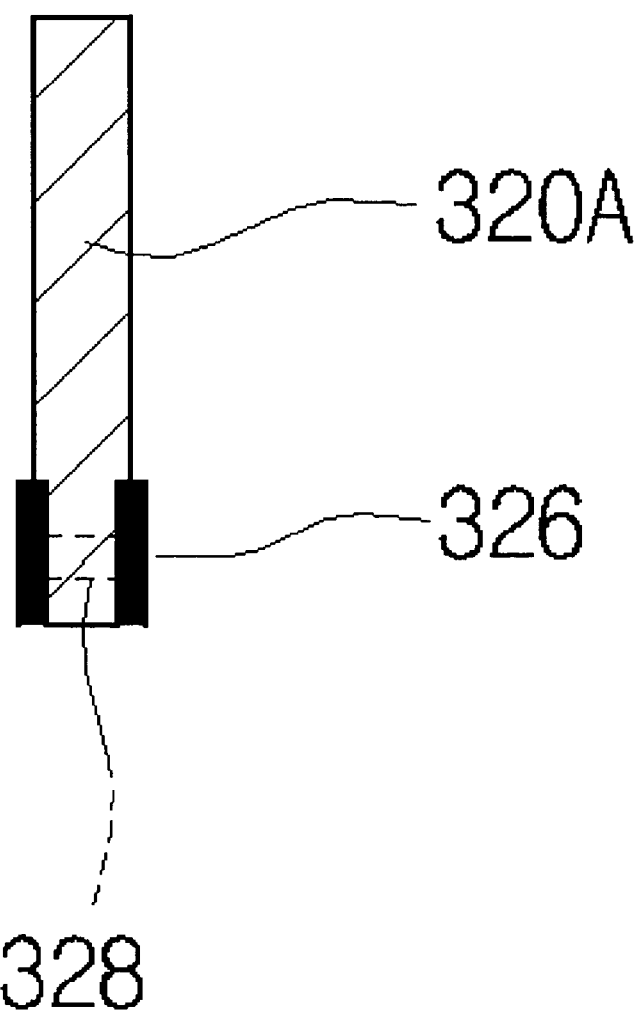
FIG. 23a is an enlarged sectional view of a substrate of the stack package of FIG. 22.
Figure 23B:
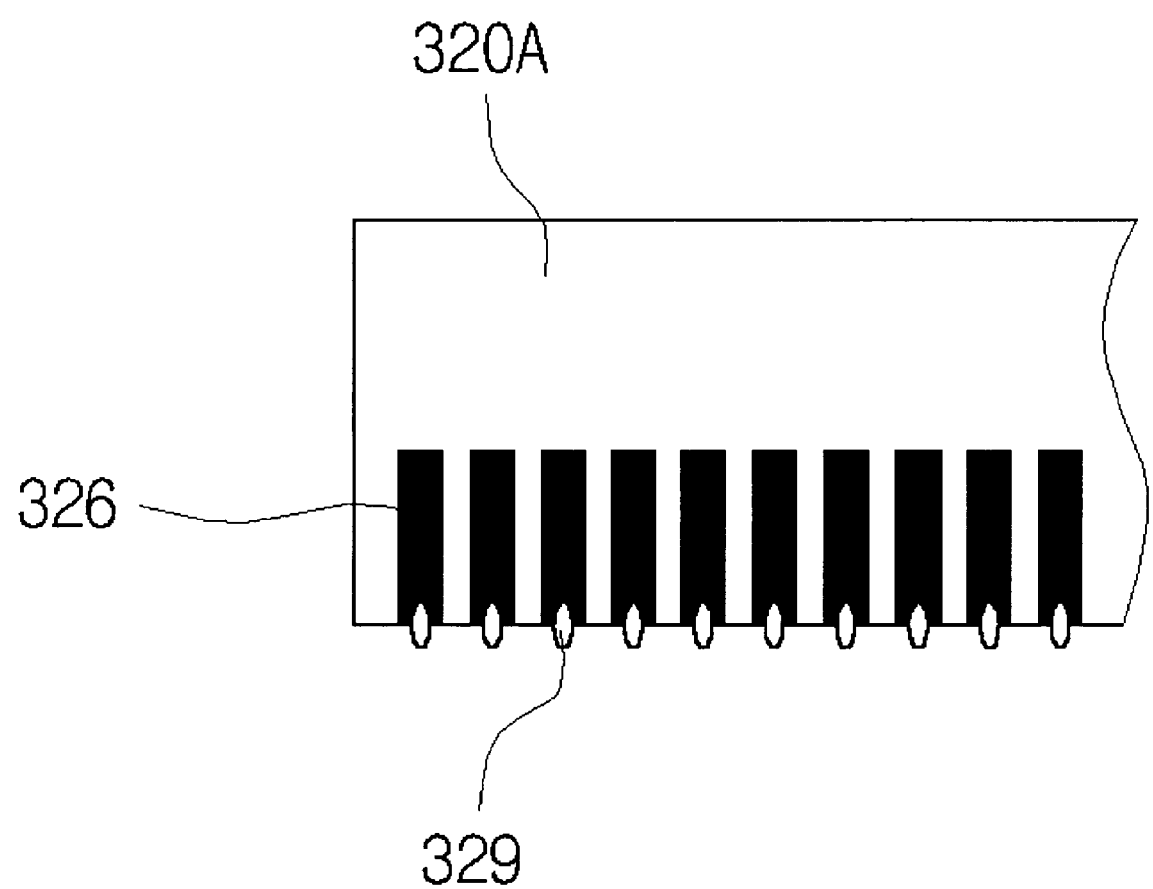
FIG. 23b is an enlarged side-sectional view of the substrate of the stack package of FIG. 22.
Figure 24:
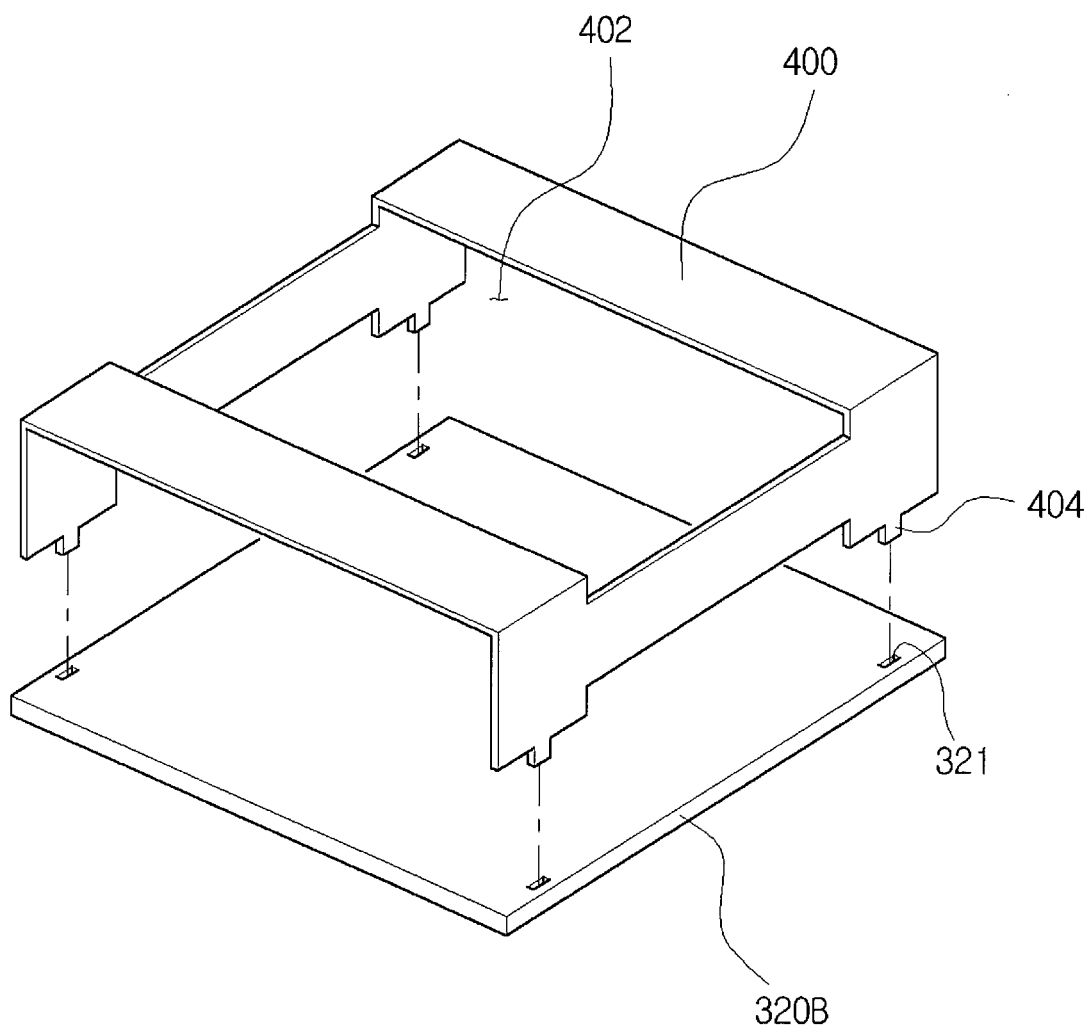
FIG. 24 is a perspective view showing an example in which a case and the substrate of the stack package of FIG. 22 are fixed.

FIG. 22 is a view of a stack package according to the sixth preferred embodiment of the present invention, FIG. 23a is an enlarged sectional view of a substrate of the stack package of FIG. 22, FIG. 23b is an enlarged side-sectional view of the substrate of the stack package of FIG. 22, and FIG. 24 is a perspective view showing an example in which a case and the substrate of the stack package of FIG. 22 are fixed.

As shown in the drawings, the stack package according to the sixth embodiment uses the flexible substrate 320A and the rigid substrate 320B, which are used in the above embodiments. However, the sixth embodiment is different from the above embodiments in that metallic pads 326 are exposed to the outside of an end of the flexible substrate 320A, and in that a case 400 is mounted on the outside of the flexible substrate 320A to support the flexible substrate 320A.

In this embodiment, the end of the flexible substrate 320A, which is in contact with the end of the rigid substrate 320B, is soldered, and electrically connected with the rigid substrate 320B by the soldered portion 329. That is, the end of the flexible substrate 320A is connected to the upper surface of the rigid substrate 320B perpendicularly, and is electrically connected with the rigid substrate 320B by the soldered portion 329 of the connection part to transmit the electric signals to each other.

Here, when the metallic pads 326 of the flexible substrate 320A are exposed to the outside as shown in FIGS. 23a and 23b, a worker can easily perform soldering work and inspection work of the connected part between the flexible substrate 320A and the rigid substrate 320B.

Furthermore, when a hole 328 perforates the flexible substrate 320A to be connected with the metallic pads 326, the hole 328 is filled with solder during the soldering, and thereby, a contact area of the soldered portion 329 is widened to keep a more strong bonding force.

The case 400 is disposed on the outside of the flexible substrate 320A of the stack package. The case 400 is mounted in such a manner to reinforce the bended form of the flexible substrate 320A. The case 400 surrounds the outside of the flexible substrate 320A to support the outside of the flexible substrate 320A. To fix the case 400 to the rigid substrate 320B, as shown in FIG. 24, the case 400 has coupling protrusions 404, and the rigid substrate 320B has coupling holes 321 at positions corresponding to the coupling protrusions 404. Moreover, the case 400 has a space 402 formed in the upper portion thereof for mounting the BGA PKG 310A onto the flexible substrate 320A.

FIGS. 25a to 25e are views showing fabricating processes of the stack package of FIG. 22 in order.

Figure 25A:
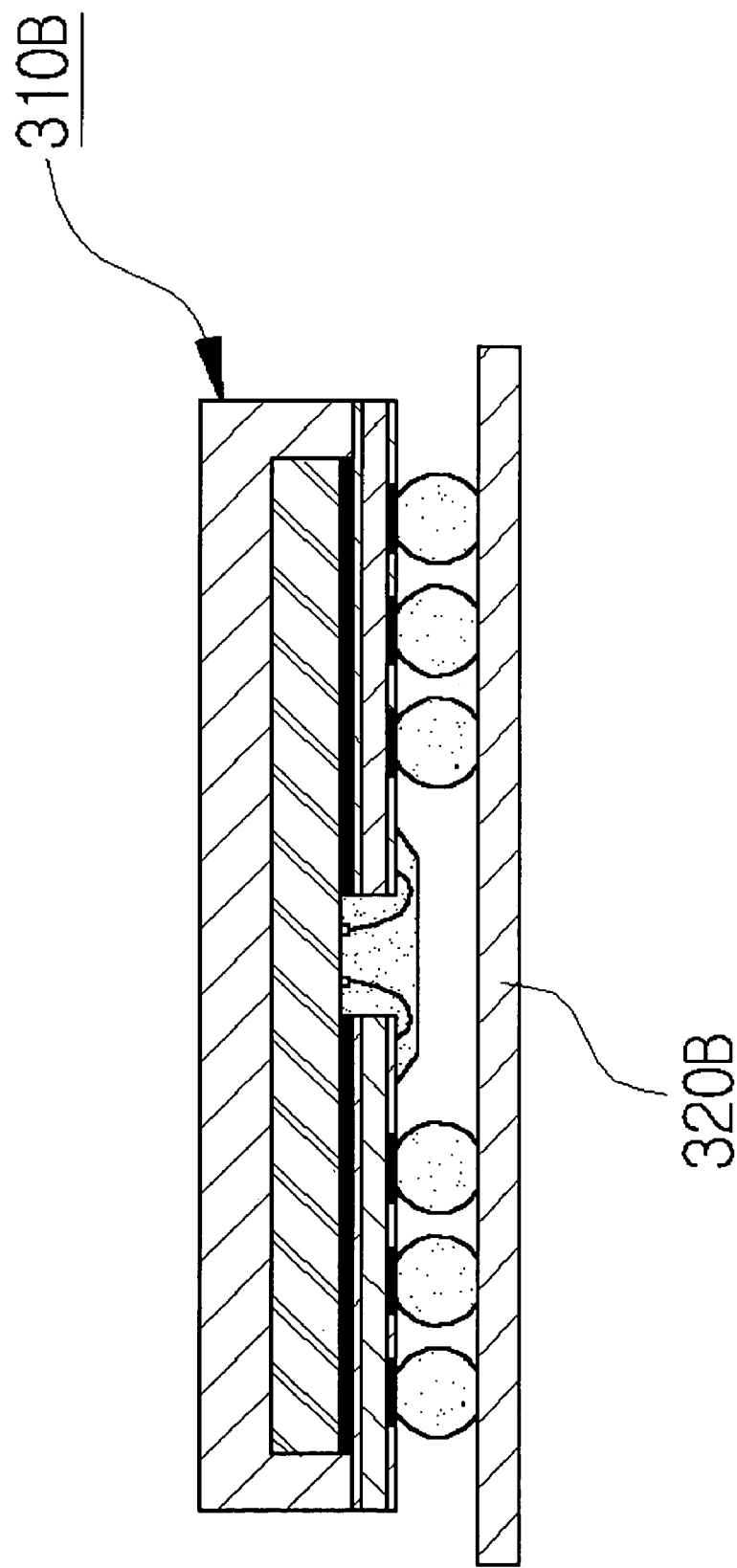
FIGS. 25a to 25e are views showing manufacturing processes of the stack package of FIG. 22 in order.

As shown in the drawings, first, one BGA PKG 310B, which has been prepared beforehand, is mounted on the upper surface of the rigid substrate 320B having the circuit pattern layer(not shown)(see FIG. 25a).

Figure 25B:
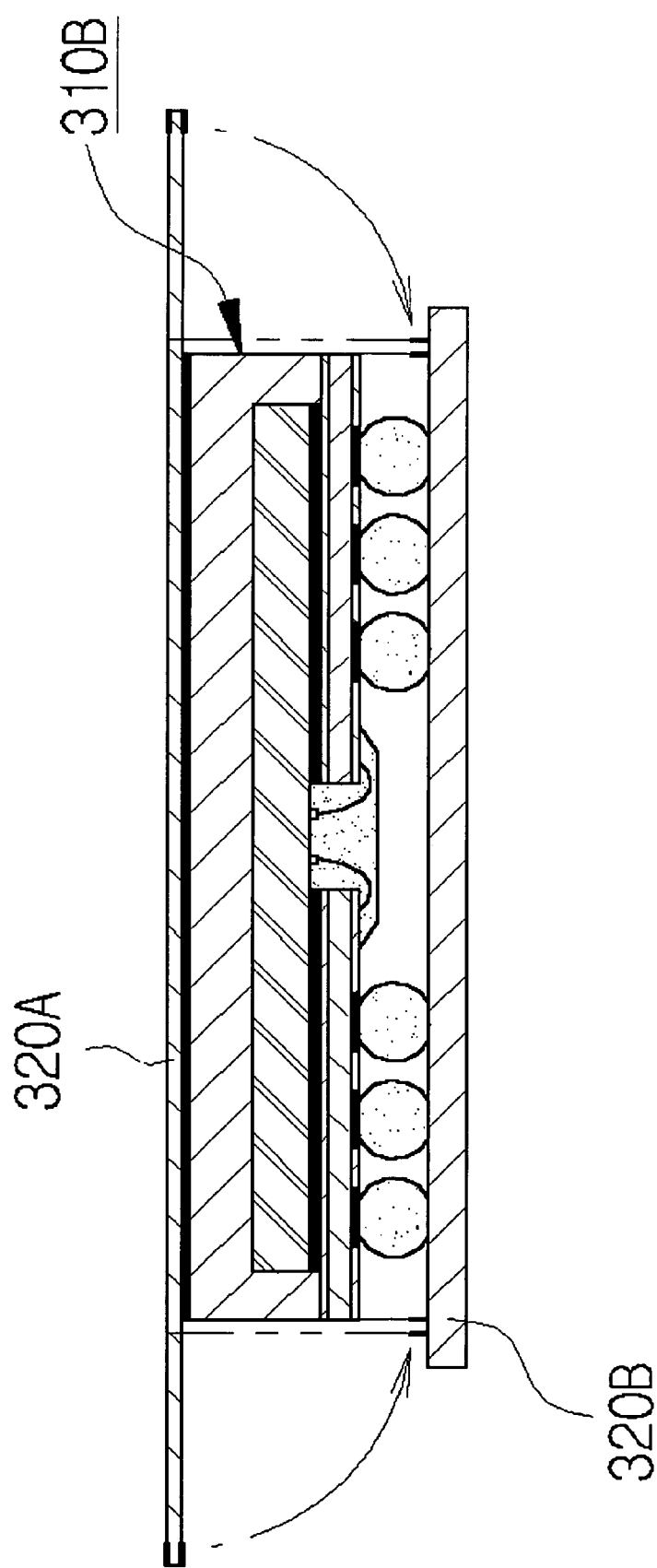
Figure 25C:
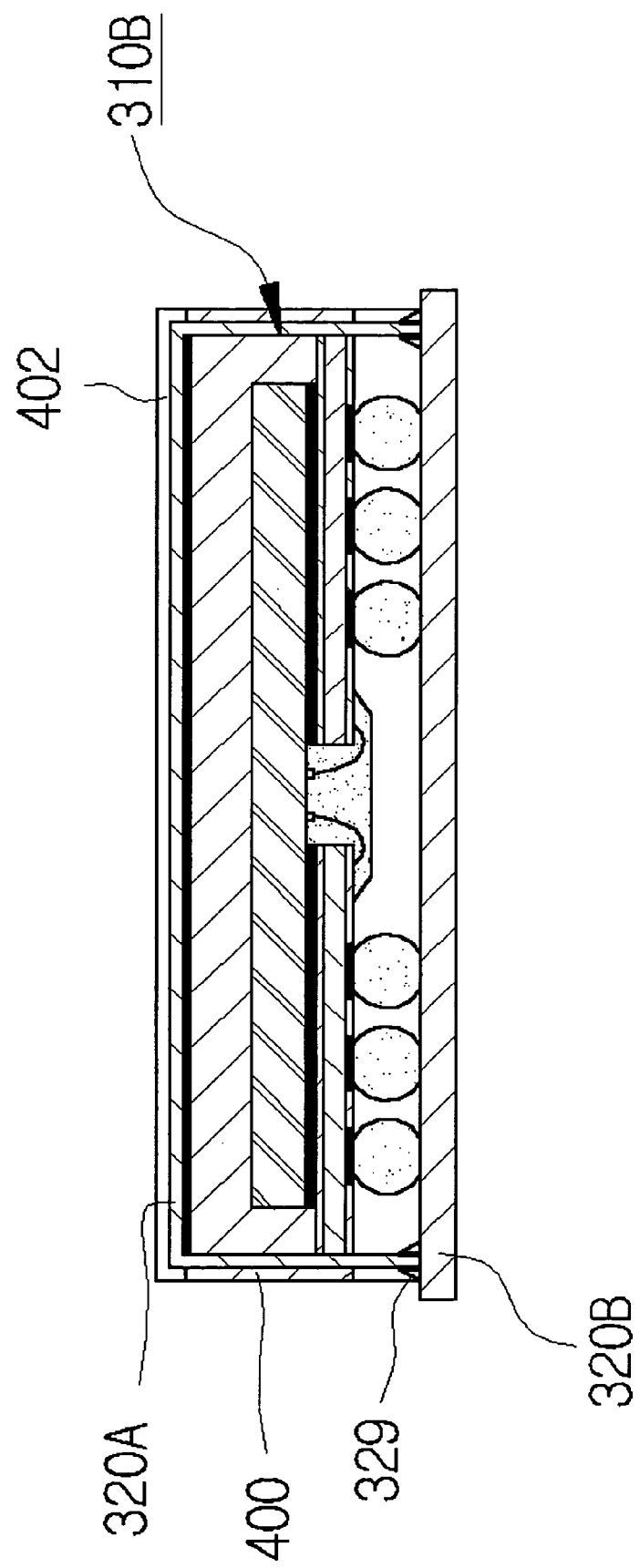

The circuit pattern layer is disposed on the upper surface of the BGA PKG 310B, and then, the flexible substrate 320A is mounted(see FIG. 25b).

As shown in FIG. 25b, both sides of the flexible substrate 320A are bended and in contact with the BGA PKG 310B in an arrow direction of FIG. 25b, to allow the ends of the flexible substrate 320A are in contact with the upper surface of the rigid substrate 320B(refer to portions indicated by dotted lines of FIG. 25b).

The case 400 for reinforcing is covered on the outside of the flexible substrate 320A to keep the bended form as it is. Before covering the case 400, the flexible substrate 320A and the rigid substrate 320B are electrically connected by the soldered portions 329 formed by soldering of the connected portions between the flexible substrate 320A and the rigid substrate 320B(see FIG. 25c).

Figure 25D:
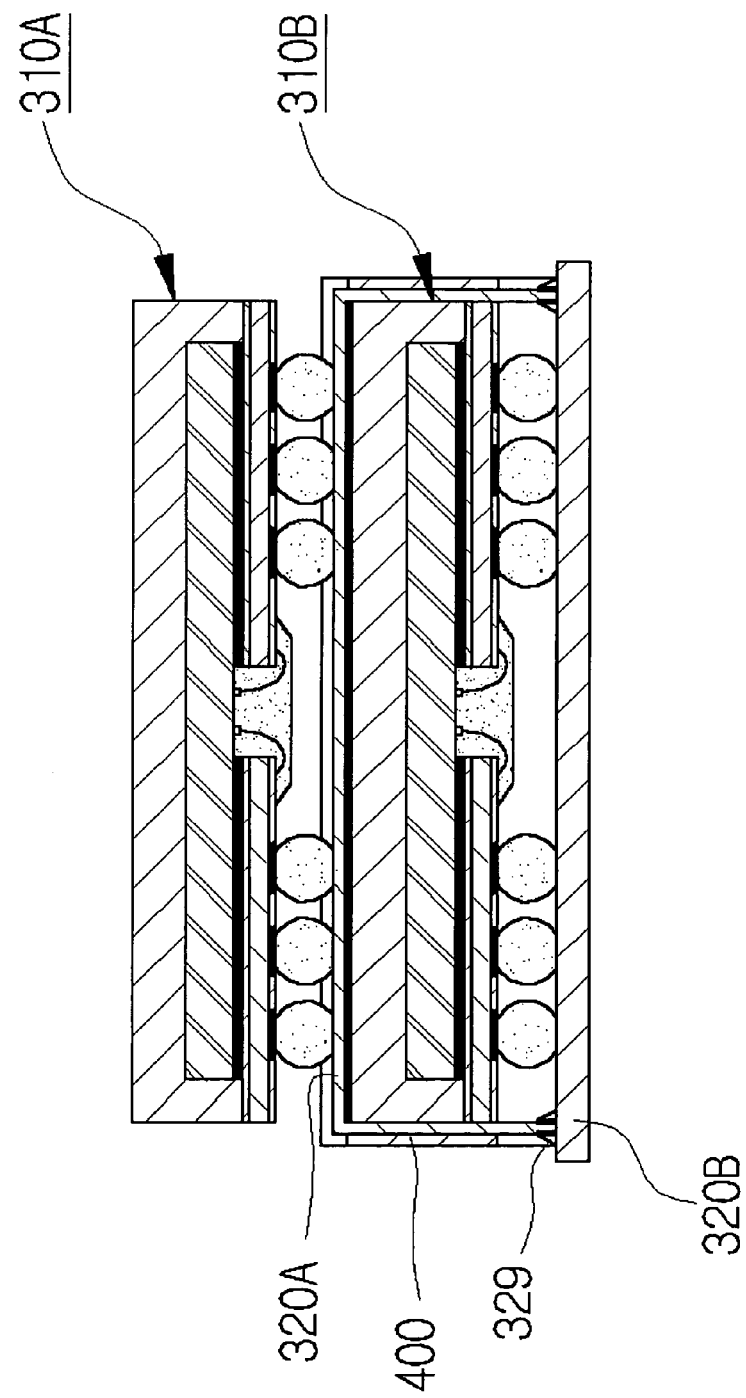

After the two substrates 320A and 320B are connected to transmit the electric signals with each other, the other BGA PKG 310A is mounted on the upper surface of the flexible substrate 320A through the space 402 formed in the case 400(see FIG. 25d).

Figure 25E:
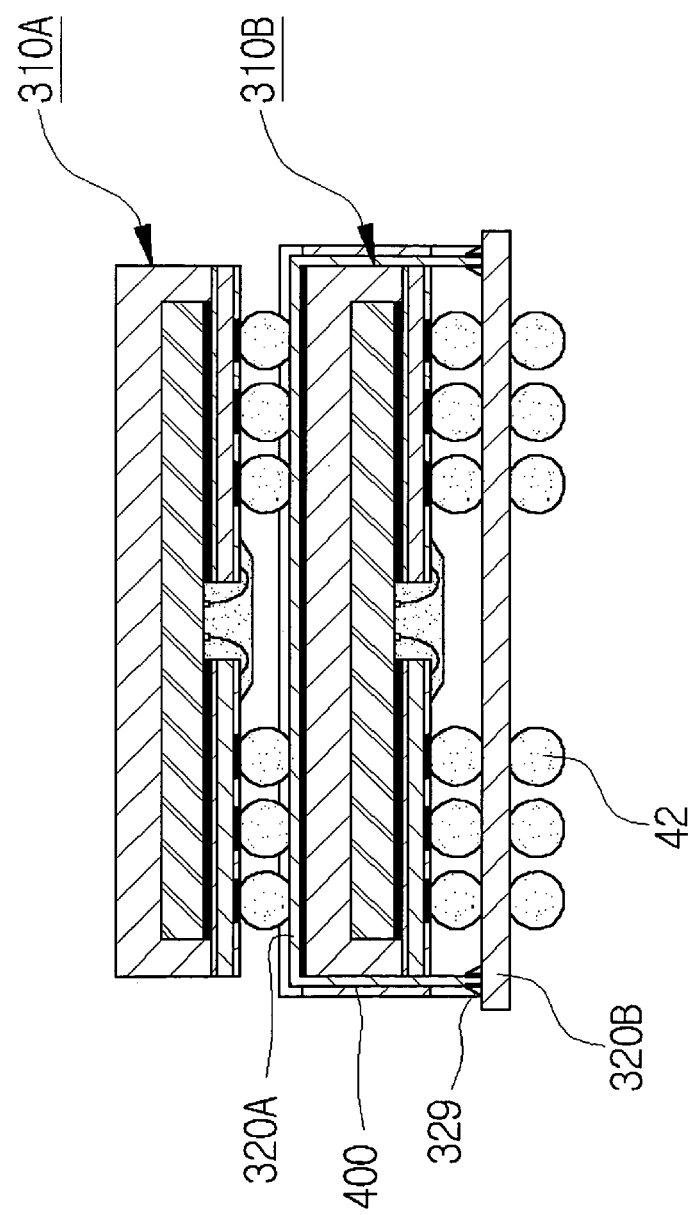

Finally, when the solder balls 42 are fused on the lower surface of the flexible substrate 320B, the stack package of FIG. 22 is finished(see FIG. 25e).

Figure 26:
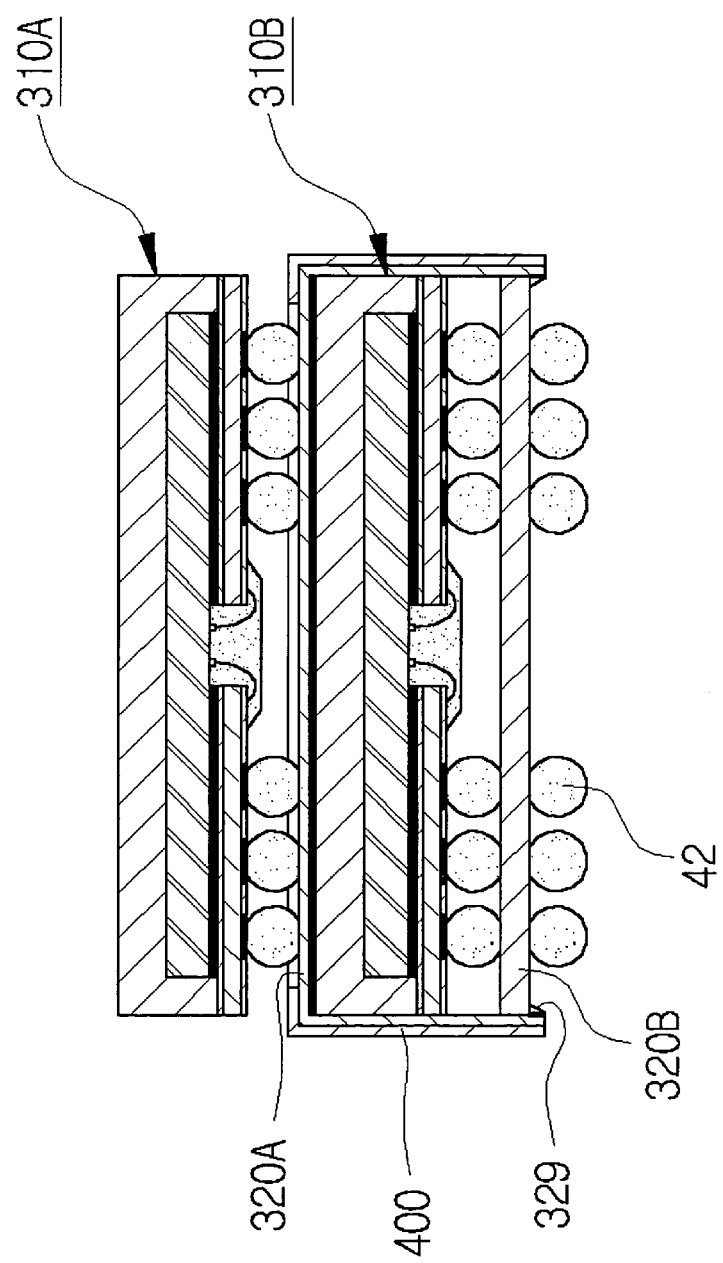
FIG. 26 is a view of a modification of the stack package of FIG. 22.
Figure 27A:
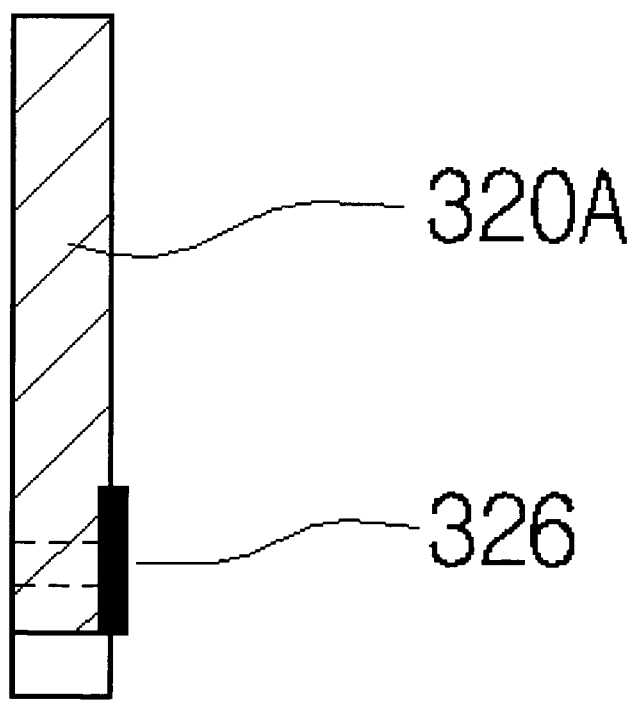
FIG. 27a is an enlarged sectional view of a substrate of the stack package of FIG. 26.
Figure 27B:
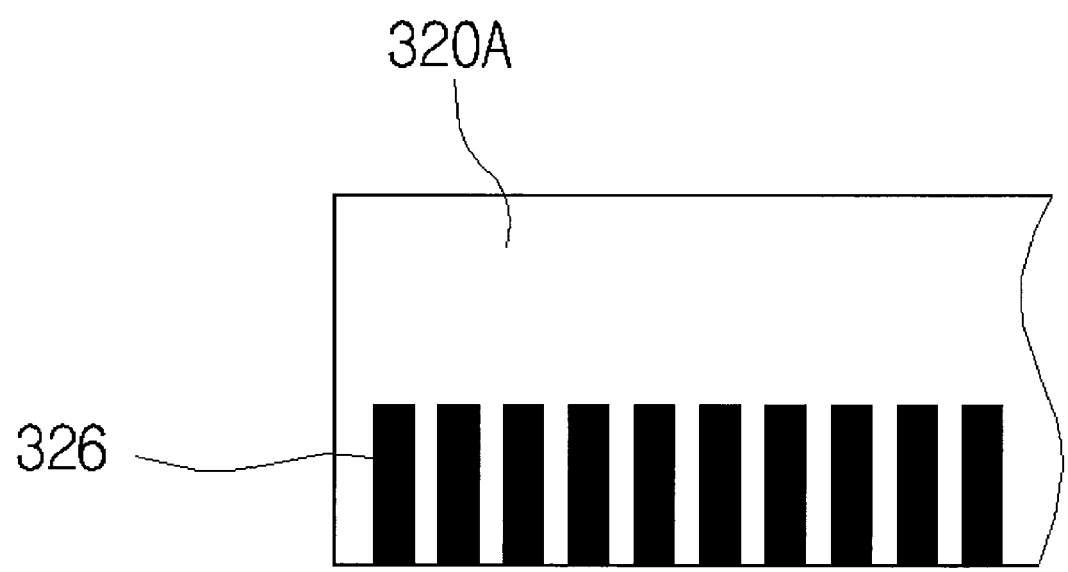
FIG. 27b is an enlarged side-sectional view of the substrate of the stack package of FIG. 26.

FIG. 26 is a view of a modification of the stack package of FIG. 22, FIG. 27a is an enlarged sectional view of a substrate of the stack package of FIG. 26, and FIG. 27b is an enlarged side-sectional view of the substrate of the stack package of FIG. 26. In FIGS. 26 to 27b, the same reference numerals as FIG. 22 designate the same parts.

In this modification of the sixth embodiment, both ends of the flexible substrate 320A are located on side surfaces of the rigid substrate 320B, and the soldered portions 329 are formed at connected portions between the flexible substrate 320A and the rigid substrate 320B to transmit the electric signals with each other.

As the ends of the flexible substrate 320A are in contact with the sides surfaces of the rigid substrate 320B, this modification has the size of the rigid substrate 320B smaller than that of the embodiment of FIG. 22, in which the ends of the flexible substrate 320A are in contact with the upper surface of the rigid substrate 320B.

Additionally, as shown in FIGS. 27a and 27b, the metallic pads 326 are formed on the ends of the flexible substrate 320A and exposed to the outside, the metallic pads 326 are exposed only to a side of the flexible substrate 320A. Description of other construction and fabricating method will be omitted as being the same as the embodiment of FIG. 22.

FIG. 28 is a view of a stack package according to the seventh preferred embodiment of the present invention. In FIG. 28, the same reference numerals as FIG. 22 designate the same parts.

In this embodiment, not the BGA PKGs but bare chips 314A and 314B are stacked in the stack package.

The bare chips 314A and 314B are mounted on the flexible substrate 320A and the rigid substrate 320B respectively, and then, wires are connected between the bare chips 314A and 314B and the substrates 320A and 320B to transmit electric signals of the bare chips 314A and 314B to the substrates 320A and 320B. The flexible substrate 320A and the rigid substrate 320B, on which the bare chips 314A and 314B are mounted, are stacked in order, and then, both sides of the flexible substrate 310A are bended so that the ends of the flexible substrate 320A meet with the upper surface of the rigid substrate 320B. The portions where the flexible substrate 320A and the rigid substrate 320B meet to each other are soldered, and connect the two substrates 320A and 320B by the soldered portions 329 to transmit the electric signals with each other. A mold 500 is covered on the outside of the stack package to protect it, and solder balls 502 are fused at the lower portion of the rigid substrate 320B, and thereby, the stack package is finished.

The stack package according to the seventh embodiment of the present invention has a size still smaller than the above embodiments as directly using the bare chips 314A and 314B, and makes the signals very short as signal lines connected from the bare chips are directly transmitted to the solder balls 502 through the two substrates 320A and 320B.

Figure 29:
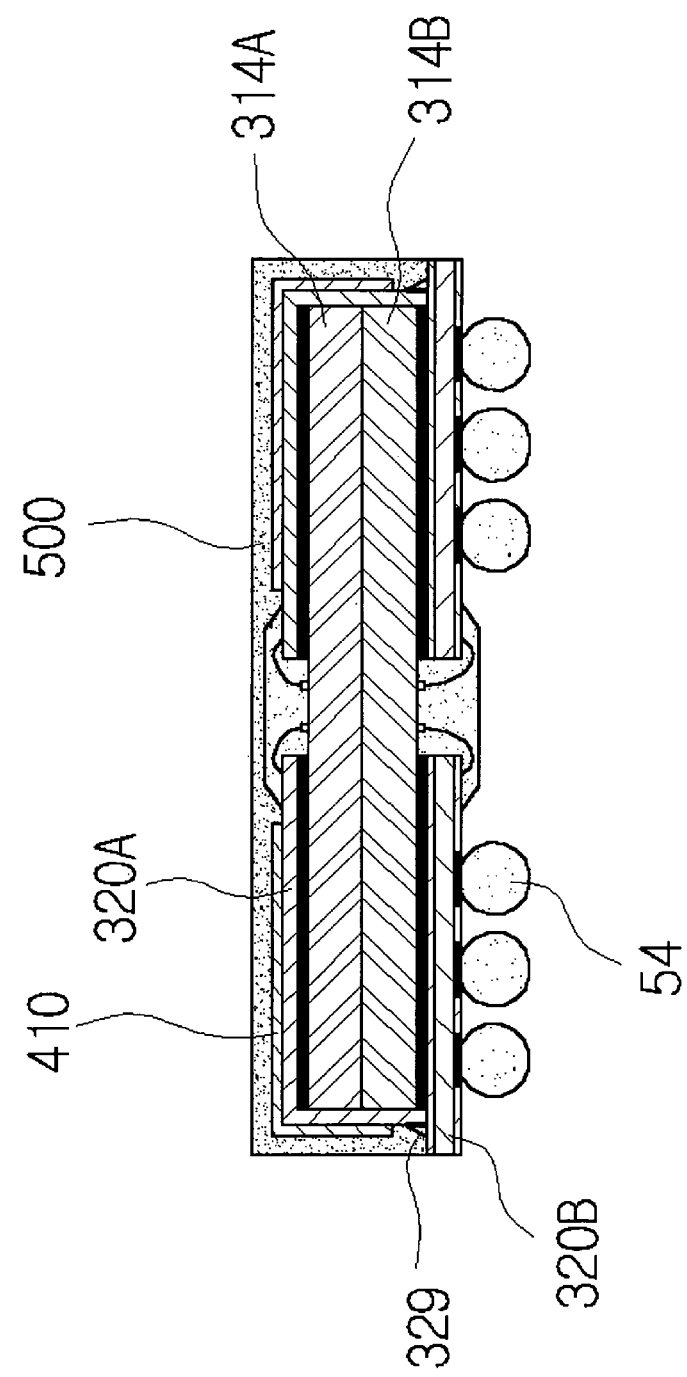
FIG. 29 is a view of a modification of the stack package of FIG. 28.

FIG. 29 is a view of a modification of the stack package of FIG. 28. In FIG. 29, the same reference numerals as FIG. 28 designate the same parts.

This modification is different from the seventh embodiment of FIG. 28 in that the opposed chips 314A and 314B connected by the wires for connecting the electric signals of the chips 314A and 314B are bonded in contact with each other, and in that a case 410 is covered on the outside of the substrate 320A to reinforce the flexible substrate 320A. Therefore, the stack package according to the modification of FIG. 29 increases reliability of products by increasing durability as reinforcing the bended portions of the flexible substrate 320A.

Description of other constructions will be omitted as being the same as the embodiment of FIG. 28.

EFFECTS OF THE INVENTION

As described above, the stack package according to the present invention is compact. Furthermore, the stack package according to the present invention can improve transmission of the electric signals by improving bonding force between the stacked BGA PKGs or the bare chips stacked on the stack package, and increase reliability of products.

What is claimed is:

1. A stack package, in which at least two or more BGA PKGs are stacked, the stack package comprising:
a flexible substrate having a circuit pattern layer formed on the surface thereof and connected with solder balls to input and output electric signals, the flexible substrate having a length extending to the outside of the BGA PKGs in both side directions of the BGA PKGs and being located between the BGA PKGs, the extending side portions of the flexible substrate being bended in contact with the lower surface of one of the BGA PKGs; and holes formed positions corresponding to the solder balls of the flexible substrate for allowing the solder balls to be inserted thereinto and in contact with the holes in such a manner to be electrically connected with the circuit pattern layer of the flexible substrate, wherein each of the holes has slits formed along the circumferences of the holes at regular intervals.

2. The stack package according to claim 1, wherein the flexible substrate has a space of a predetermined width formed in the side thereof.

3. The stack package according to claim 1, further comprising a package-bonding adhesive located between the stacked BGA PKGs to bond the stacked BGA PKGs more strongly.

4. A stack package, in which at least two or more BGA PKGs having solder balls are stacked, the stack package comprising:
a flexible substrate of the size wider than that of the BGA PKGs, the flexible substrate having a circuit pattern layer disposed on the surface thereof to be electrically connected with the solder balls, the flexible substrate being located between the BGA PKGs to be connected with the BGA PKGs and having both end portions bended in contact with side walls of the BGA PKGs stacked on the lower portion thereof; and
a rigid substrate of the side wider than the BGA PKGs, the rigid substrate being located at the lowermost portion of the BGA PKG to support the BGA PKG, the rigid substrate having a circuit pattern layer disposed on the surface thereof in such a manner to be electrically connected with the solder balls of the BGA PKGs and the flexible substrate, wherein the flexible substrate has coupling holes containing slits formed along the circumferences of the holes at regular intervals for inserting and fusing the solder balls.

5. The stack package according to claim 4, wherein the flexible substrate has metallic pads located at the bended portions thereof, and the bended portions are soldered in such a manner to be connected to the upper surface of the rigid substrate.

6. The stack package according to claim 4, wherein the flexible substrate has metallic pads located at the bended portions thereof, and the bended portions are soldered in such a manner that the end portions of the flexible substrate are soldered on both sides of the top surface of the rigid substrate.

7. The stack package according to claim 4, wherein one of the BGA PKGs has a case mounted on the outside thereof to reinforce the flexible substrate.

8. The stack package according to claim 4, wherein the flexible substrate has at least two or more rigid materials mounted at least two or more positions thereof, the rigid materials having the corresponding width of the BGA PKGs.

9. The stack package according to claim 8, wherein the flexible substrate is above the top surface of the rigid substrate completely surrounding the lower BGA PKG.

10. A stack package, in which at least two or more bare chips are stacked, the stack package comprising:
a flexible substrate of the size wider than that of the bare chips, the flexible substrate having a circuit pattern layer formed on the surface thereof, wherein a circuit board supporting one of the bare chips has an opening formed in the center thereof for connecting the one of the bare chips, the circuit board being located above the flexible substrate, the flexible substrate being located between the bare chips to be electrically connected with the bare chips, both end portions of the flexible substrate being bended and extended below lower portions of the lower bare chip; and a rigid substrate of the same width as the flexible substrate, the rigid substrate being located at the lowermost portion of one of the bare chips to support the one of the bare chips, the rigid substrate having a circuit pattern layer disposed on the surface thereof in such a manner to be electrically connected with the bare chips and the flexible substrate, the rigid substrate having an opening formed in the center thereof for connecting the bare chip.

11. The stack package according to claim 10, wherein the bended portions of the flexible substrate are connected to the surface of the rigid substrate.

12. The stack package according to claim 10, wherein the bended portions of the flexible substrate are connected to both side walls of the rigid substrate.

13. The stack package according to claim 10, further comprising a case for surrounding the whole outside of the flexible substrate to keep the form of the flexible substrate.

* * * * *